(12) United States Patent
Chen et al.

(10) Patent No.: US 11,366,556 B2
(45) Date of Patent: Jun. 21, 2022

(54) ELECTRONIC SUBSTRATE AND MANUFACTURE METHOD THEREOF, AND ELECTRONIC DEVICE

(71) Applicants: Hefei Xinsheng Optoelectronics Technology Co., Ltd., Anhui (CN); BOE Technology Group Co., Ltd., Beijing (CN)

(72) Inventors: Jun Chen, Beijing (CN); Ming Zhang, Beijing (CN); Qicheng Chen, Beijing (CN); Huan Liu, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 428 days.

(21) Appl. No.: 16/475,804

(22) PCT Filed: Dec. 24, 2018

(86) PCT No.: PCT/CN2018/123230
§ 371 (c)(1),
(2) Date: Jul. 3, 2019

(87) PCT Pub. No.: WO2019/148999
PCT Pub. Date: Aug. 8, 2019

(65) Prior Publication Data
US 2021/0405810 A1    Dec. 30, 2021

(30) Foreign Application Priority Data
Jan. 30, 2018   (CN) .......................... 201810089650.6

(51) Int. Cl.
*G06F 3/044*  (2006.01)
*G06F 3/041*  (2006.01)
(Continued)

(52) U.S. Cl.
CPC .......... *G06F 3/0443* (2019.05); *G06F 3/0412* (2013.01); *G06F 3/04164* (2019.05);
(Continued)

(58) Field of Classification Search
CPC . G06F 3/041–0412; G06F 3/044–0448; G06F 3/04164; G06F 2203/04103;
(Continued)

(56) References Cited

U.S. PATENT DOCUMENTS 8,029,886 B2    10/2011   Nashiki et al.
10,013,097 B2    7/2018   Choung et al.
(Continued)

FOREIGN PATENT DOCUMENTS

CN    103700665 A    4/2014
CN    104157613 A    11/2014
(Continued)

OTHER PUBLICATIONS

Sep. 23, 2020—(KR) First Office Action Appn 10-2019-7026165 with English Translation.
(Continued)

*Primary Examiner* — Sanjiv D. Patel
(74) *Attorney, Agent, or Firm* — Banner & Witcoff, Ltd.

(57) ABSTRACT

An electronic substrate and a manufacture method thereof, and an electronic device are provided, the electronic substrate includes a base substrate and a first conductive structure on the base substrate, a portion of the first conductive structure on the base substrate and at least on a side of the first conductive structure away from the base substrate has an etching barrier property.

17 Claims, 7 Drawing Sheets

(51) Int. Cl.
*H05K 1/02* (2006.01)
*H05K 1/09* (2006.01)
*H05K 3/46* (2006.01)

(52) U.S. Cl.
CPC .............. *H05K 1/0298* (2013.01); *H05K 1/09* (2013.01); *H05K 3/4644* (2013.01); *G06F 3/0446* (2019.05); *G06F 2203/04103* (2013.01)

(58) Field of Classification Search
CPC ........... G02F 1/136227; G02F 1/13338; G02F 1/155; G02F 1/13458; G02F 1/136295; G02F 1/133305
See application file for complete search history.

(56) References Cited

U.S. PATENT DOCUMENTS

| | | |
|---|---|---|
| 2012/0262385 A1 | 10/2012 | Kim et al. |
| 2014/0102764 A1 | 4/2014 | Fujino et al. |
| 2015/0002760 A1* | 1/2015 | Morimoto ............... G06F 3/041 349/12 |
| 2015/0162908 A1 | 6/2015 | Hsu |
| 2016/0197191 A1 | 7/2016 | Cao et al. |
| 2017/0017319 A1 | 1/2017 | Du et al. |
| 2017/0082922 A1 | 3/2017 | Kang et al. |
| 2017/0192575 A1* | 7/2017 | Jin ........................ G06F 3/0412 |
| 2017/0277314 A1* | 9/2017 | Chen ..................... G06F 3/0412 |
| 2018/0145256 A1* | 5/2018 | Yang .................. H01L 51/0097 |

FOREIGN PATENT DOCUMENTS

| | | |
|---|---|---|
| CN | 104635991 A | 5/2015 |
| CN | 104699285 A | 6/2015 |
| CN | 106601754 A | 4/2017 |
| CN | 107229360 A | 10/2017 |
| CN | 107463031 A | 12/2017 |
| JP | H08174746 A | 7/1996 |
| JP | 2012172219 A | 9/2012 |
| KR | 1020070054357 A | 5/2007 |
| KR | 100911640 B1 | 8/2009 |
| KR | 1020150092813 A | 8/2015 |

OTHER PUBLICATIONS

Jan. 6, 2021—(KR) Second Office Action Appn 10-2019-7026165 with English Translation.
Mar. 26, 2019—(WO) the International Search Report and Written Opinion Appn PCT/CN2018/123230 with English Translation.
Dec. 4, 2019—(CN) First Office Action Appn 201810089650.6 with English Translation.
Sep. 7, 2021—EP—EESR Appn No. 18893322.0.

* cited by examiner

ELECTRONIC SUBSTRATE AND MANUFACTURE METHOD THEREOF, AND ELECTRONIC DEVICE

CROSS-REFERENCE TO RELATED APPLICATION

The application is a U.S. National Phase Entry of International Application No. PCT/CN2018/123230 filed on Dec. 24, 2018, designating the United States of America and claiming priority to Chinese Patent Application No. 201810089650.6, filed on Jan. 30, 2018. The present application claims priority to and the benefit of the above-identified applications and the above-identified applications are incorporated by reference herein in their entirety.

TECHNICAL FIELD

The embodiments of the present disclosure relate to an electronic substrate and a manufacture method thereof, and an electronic device.

BACKGROUND

Touch substrates can be classified into, for example, a resistive-type touch substrate, a capacitive-type touch substrate, an optical-type touch substrate, an acoustic-wave-type touch substrate, an electromagnetic-type touch substrate, and the like according to different sensing principles. Because the capacitive-type touch substrate has advantages of fast reaction time, high sensitivity, good reliability, high durability, and the like, the capacitive-type touch substrate has been applied in more and more fields. The capacitive-type touch substrate, for example, generally comprises structures such as an electrode layer, a wiring layer, and so on, and is used for detecting a touch position of a touch object.

SUMMARY

At least one embodiment of the present disclosure provides an electronic substrate, which comprises a base substrate and a first conductive structure, the first conductive structure is on the base substrate, a portion of the first conductive structure on a side of the first conductive structure away from the base substrate is a first portion, a portion of the first conductive structure on a side of the first conductive structure close to the base substrate is a second portion, and the first portion has an etching barrier property compared with the second portion.

For example, in the electronic substrate provided by an embodiment of the present disclosure, the first conductive structure is a single layer film structure.

For example, in the electronic substrate provided by an embodiment of the present disclosure, a crystallinity of the first portion is greater than a crystallinity of the second portion.

For example, in the electronic substrate provided by an embodiment of the present disclosure, the first conductive structure is in a stacked structure and comprises a first conductive layer and a barrier layer stacked on a side of the first conductive layer away from the base substrate, and the barrier layer is the first portion of the first conductive structure.

For example, in the electronic substrate provided by an embodiment of the present disclosure, a crystallinity of a material of the first conductive layer is less than a crystallinity of a material of the barrier layer.

For example, in the electronic substrate provided by an embodiment of the present disclosure, both a material of the first conductive layer is and a material of the barrier layer comprise conductive oxides.

For example, in the electronic substrate provided by an embodiment of the present disclosure, the conductive oxides are indium tin oxides, and a ratio of $In_2O_3$ to $SnO_2$ in indium tin oxide of the barrier layer is higher than a ratio of $In_2O_3$ to $SnO_2$ in indium tin oxide of the first conductive layer; or the conductive oxides are indium zinc oxides, and a ratio of $In_2O_3:ZnO_2$ in indium zinc oxide of the barrier layer is higher than a ratio of $In_2O_3:ZnO_2$ in indium zinc oxide of the first conductive layer.

For example, in the electronic substrate provided by an embodiment of the present disclosure, a material of the first conductive layer comprises a conductive oxide, and a material of the barrier layer comprises at least one or more of a group consisting of a crystallized metal, a crystallized conductive oxide, and a polymer conductive material.

For example, the electronic substrate provided by an embodiment of the present disclosure further comprises a second conductive structure on the base substrate, for an etchant for etching at least a portion material of the second conductive structure, an etching barrier capability of the first portion of the first conductive structure is greater than an etching barrier capability of the at least a portion material of the second conductive structure.

For example, in the electronic substrate provided by an embodiment of the present disclosure, the at least a portion material of the second conductive structure comprises a conductive oxide.

For example, in the electronic substrate provided by an embodiment of the present disclosure, the second conductive structure comprises an overlap portion overlapping an orthographic projection of the first conductive structure on the base substrate, and the first conductive structure comprises a portion between the overlap portion of the second conductive structure and the base substrate.

For example, in the electronic substrate provided by an embodiment of the present disclosure, the overlap portion is entirely in direct contact with the first conductive structure.

For example, in the electronic substrate provided by an embodiment of the present disclosure, a first lower surface of the first conductive substrate close to the base substrate and a second lower surface of the second conductive structure close to the base substrate are both in direct contact with the base substrate.

For example, the electronic substrate provided by an embodiment of the present disclosure further comprises an insulation layer covering the first conductive structure and the second conductive structure, the insulation layer directly contacts an upper surface of the first conductive structure away from the base substrate and an upper surface of the second conductive structure away from the base substrate.

For example, the electronic substrate provided by an embodiment of the present disclosure further comprises a wiring structure, the touch substrate comprises a touch area and a non-touch area, one of the first conductive structure and the second conductive structure is in the touch area, and at least a portion of the other of the first conductive structure and the second conductive structure is in the non-touch area.

For example, in the electronic substrate provided by an embodiment of the present disclosure, one of the first conductive structure and the second conductive structure is a wiring structure, and the wiring structure is in a stacked structure; and the wiring structure comprises a stacked layer of a first wiring layer and a second wiring layer which are sequentially stacked on the base substrate, or the wiring structure comprises a stacked layer of a second wiring layer and a third wiring layer which are sequentially stacked on the base substrate, or the wiring structure comprises a stacked layer of a first wiring layer, a second wiring layer, and a third wiring layer which are sequentially stacked on the base substrate.

For example, in the electronic substrate provided by an embodiment of the present disclosure, a material of at least one of the first wiring layer and the third wiring layer is at least partially identical to a material of the first conductive structure.

For example, in the electronic substrate provided by an embodiment of the present disclosure, a material of the first wiring layer and a material of the third wiring layer comprise a conductive oxide, and a material of the second wiring layer comprises a metal.

For example, in the electronic substrate provided by an embodiment of the present disclosure, one of the first conductive structure and the second conductive structure is a first touch electrode structure, and the first touch electrode structure comprises a plurality of block-shaped first sub-electrode patterns and a plurality of strip-shaped second sub-electrode patterns; the electronic substrate further comprises a second touch electrode structure, the second touch electrode structure and the first touch electrode structure are in different layers, and the second touch electrode structure electrically connects adjacent first sub-electrode patterns which are spaced apart by the second sub-electrode patterns.

At least one embodiment of the present disclosure provides an electronic device, and the electronic device comprises the electronic substrate according to any one embodiment of the present disclosure.

At least one embodiment of the present disclosure provides a manufacture method of an electronic substrate, and the manufacture method comprises: forming a first conductive structure on a base substrate, in which a portion of the first conductive structure on a side of the first conductive structure away from the base substrate is a first portion, a portion of the first conductive structure on a side of the first conductive structure close to the base substrate is a second portion, and the first portion has an etching barrier property compared with the second portion.

For example, in the method provided by an embodiment of the present disclosure, forming the first conductive structure comprises: forming a first conductive layer film on the base substrate, patterning the first conductive layer film to form a first conductive pattern, and at least partially crystallizing the first conductive pattern from a side of the first conductive pattern away from the base substrate to form the first conductive structure.

For example, in the method provided by an embodiment of the present disclosure, forming the first conductive structure comprises: forming a first conductive layer film on the base substrate, forming a barrier layer film on the first conductive layer film, and patterning the first conductive layer film and the barrier layer film to form a first conductive layer and a barrier layer respectively, in which the first conductive structure comprises the first conductive layer and the barrier layer.

For example, in the method provided by an embodiment of the present disclosure, a material of the first conductive layer film comprises a conductive oxide.

For example, the method provided by an embodiment of the present disclosure further comprises: forming a second conductive structure on the base substrate on which the first conductive structure is formed, in which for an etchant for etching at least a portion material of the second conductive structure, an etching barrier capability of the first portion of the first conductive structure is greater than an etching barrier capability of the at least a portion material of the second conductive structure.

For example, the method provided by an embodiment of the present disclosure further comprises: one of the first conductive structure and the second conductive structure is a first touch electrode structure and the other is a wiring structure; the wiring structure is in a stacked structure and is formed on a same layer as the first touch electrode structure or formed on the first touch electrode structure.

For example, in the method provided by an embodiment of the present disclosure, forming the wiring structure comprises: sequentially forming a first wiring layer film, a second wiring layer film, and a third wiring layer film on the base substrate; and patterning a stacked layer of the first wiring layer film, the second wiring layer film, and the third wiring layer film to form the wiring structure.

For example, in the method provided by an embodiment of the present disclosure, one of the first conductive structure and the second conductive structure is a first touch electrode structure, and the first touch electrode structure comprises a plurality of block-shaped first sub-electrode patterns and a plurality of strip-shaped second sub-electrode patterns, and plurality of block-shaped first sub-electrode patterns and the plurality of strip-shaped second sub-electrode patterns are interlaced; the method further comprises forming a second touch electrode structure which is on a different layer from the first touch electrode structure, and the second touch electrode structure electrically connecting adjacent first sub-electrode patterns which are spaced apart by the second sub-electrode patterns.

At least one embodiment of the present disclosure provides an electronic substrate, which comprises: a base substrate, a first conductive structure on the base substrate, and a second conductive structure on the base substrate. For an etchant for etching at least a portion material of the second conductive structure, an etching barrier capability of at least a portion of the first conductive structure on a side of the first conductive structure away from the base substrate is greater than an etching barrier capability of the at least a portion material of the second conductive structure.

For example, in the electronic substrate provided by an embodiment of the present disclosure, a first lower surface of the first conductive substrate close to the base substrate and a second lower surface of the second conductive structure close to the base substrate are in direct contact with the base substrate.

For example, the electronic substrate provided by an embodiment of the present disclosure further comprises an insulation layer covering the first conductive structure and the second conductive structure, the insulation layer directly contacts an upper surface of the first conductive structure away from the base substrate and an upper surface of the second conductive structure away from the base substrate.

For example, in the electronic substrate provided by an embodiment of the present disclosure, the second conductive structure comprises an overlap portion overlapping an orthographic projection of the first conductive structure on the base substrate, and the first conductive structure comprises a portion between the overlap portion of the second conductive structure and the base substrate.

For example, in the electronic substrate provided by an embodiment of the present disclosure, the overlap portion of the second conductive structure is entirely in direct contact with the first conductive structure.

For example, an embodiment of the present disclosure provides an electronic device, which comprises the electronic substrate according to any one of the above embodiments.

At least one embodiment of the present disclosure provides a manufacture method of an electronic substrate, and the method comprises: forming a first conductive structure on a base substrate; and then forming a second conductive structure on the base substrate, in which for an etchant for etching at least a portion material of the second conductive structure, an etching barrier capability of a portion of the first conductive structure on a side of the first conductive structure at least away from the base substrate is greater than an etching barrier capability of the at least a portion material of the second conductive structure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
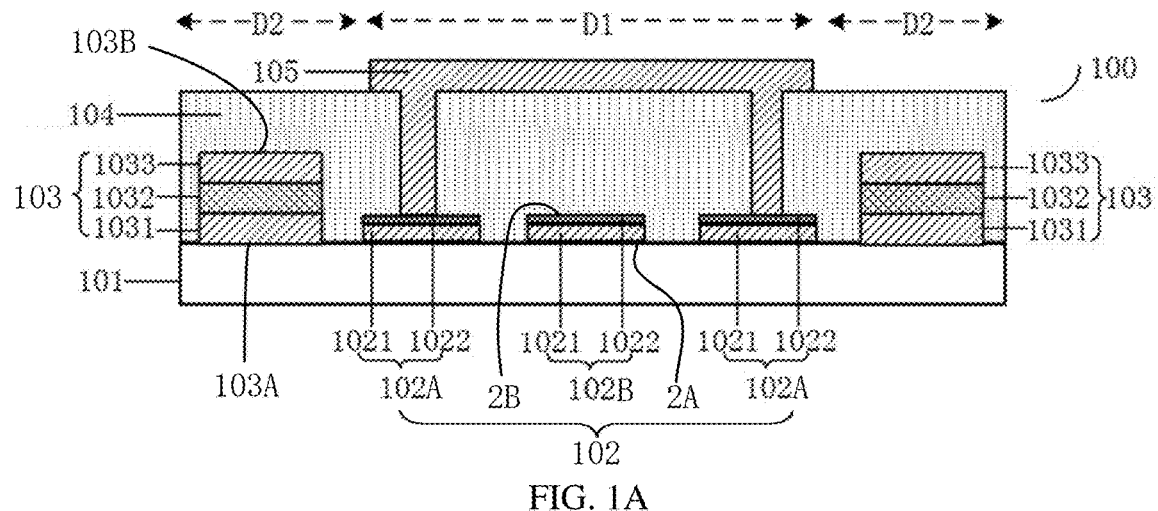
FIG. 1A and FIG. 1B are schematic cross-sectional structural views of a touch substrate according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A capacitive-type touch substrate, for example, generally comprises structures such as an electrode layer, a wiring layer, or the like. A material of the electrode layer is generally a transparent metal oxide, and a material of the wiring layer is generally copper or silver, because the copper or silver has good ductility and electrical conductivity. However, the copper or silver metal layer has poor adhesion to, for example, a base substrate and has insufficient antioxidant capacity.

In order to improve the adhesion of the copper or silver metal layer to the base substrate, for example, a buffer layer is manufactured under the copper or silver metal layer, and a material the buffer layer may be, for example, a metal or a metal oxide; meanwhile, in order to prevent the copper or silver metal layer from being exposed to air to cause oxidation, for example, a protective layer is formed on the copper or silver metal layer, and the material of the protective layer may be, for example, a metal or a metal oxide. The wiring structure formed by a plurality of films can improve the adhesion of the copper or silver metal layer and has high oxidation resistance. However, because the material of the wiring structure and the material of the electrode layer are both metal oxides, when etching the wiring layer, the etching solution for etching the wiring layer is easy to further etch the electrode layer that has been patterned under the wiring layer, thereby affecting the dimensional accuracy of the electrode layer or even causing the electrode layer to be broken, thus affecting the touch effect of, for example, a touch panel composed of the electrode layer.

At least one embodiment of the present disclosure provides an electronic substrate and a manufacture method thereof, and an electronic device. In some embodiments, the electronic substrate is a touch substrate, such as a capacitive-type touch substrate. In some embodiments, the electronic substrate is a flexible substrate, such as a flexible touch substrate.

The electronic substrate comprises a base substrate and a first conductive structure, the first conductive structure is on the base substrate, and a portion of the first conductive structure at least on a side of the first conductive structure away from the base substrate has an etching barrier property.

For example, the first conductive structure has such an etching barrier property: a portion of the first conductive structure on a side of the first conductive structure away from the base substrate is a first portion (that is, a portion where an upper surface of the first conductive structure away from the base substrate is located), a portion of the first conductive structure on a side of the first conductive structure close to the base substrate is a second portion (that is, a portion where a lower surface of the first conductive structure close to the base substrate is located), and the first portion has an etching barrier property compared with the second portion, that is, for the same etchant, the etching barrier capability of the first portion is greater than the etching barrier capability of the second portion, such that the first portion is harder to be etched than the second portion.

For example, the electronic substrate comprises a first conductive structure and a second conductive structure that are located on the base substrate, and the first conductive structure has such an etching barrier property: for an etchant for etching at least a portion material of the second conductive structure, an etching barrier capability of at least a portion of the first conductive structure on a side of the first conductive structure away from the base substrate is greater than an etching barrier capability of the at least a portion material of the second conductive structure, that is, the upper surface of the first conductive structure is harder to be etched by the etchant than the at least a portion material of the second conductive structure. In this case, for example, an etching barrier capability of the first portion of the first conductive structure is greater than or equal to an etching barrier capability of the second portion of the first conductive structure.

For example, the second conductive structure comprises a portion located outside the orthographic projection of the first conductive structure on the base substrate, and the second conductive structure comprises a portion located outside a layer where the first conductive structure is located (that is, the first conductive structure and at least a portion of the second conductive structure are disposed in different layers, so that the first conductive structure and at least a portion of the second conductive structure are manufactured by different photolithography processes during a manufacture process).

Correspondingly, the manufacture method of the electronic substrate comprises: forming a first conductive structure on the base substrate, in which at least a portion of the first conductive structure on a side of the first conductive structure away from the base substrate has an etching barrier property.

For example, in the manufacture method, the portion of the first conductive structure on a side of the first conductive structure away from the base substrate is a first portion, a portion of the first conductive structure on a side of the first conductive structure close to the base substrate is a second portion, and the first portion has an etching barrier property compared with the second portion.

For example, in a case where the electronic substrate comprises the second conductive structure, the manufacture method of the electronic substrate comprises: forming the first conductive structure on the base substrate; then, forming the second conductive structure on the base substrate. For an etchant for etching at least a portion material of the second conductive structure, an etching barrier capability of at least a portion (that is, the first portion) of the first conductive structure on a side of the first conductive structure away from the base substrate is greater than an etching barrier capability of the at least a portion material of the second conductive structure.

In at least one embodiment of the present disclosure, at least the portion of the first conductive structure on the side of the first conductive structure away from the base substrate has a strong etching barrier property, so that the embodiment of the present disclosure has a relatively good etching barrier property. For example, in a case where the etching barrier capability of at least the portion of the first conductive structure on the side of the first conductive structure away from the base substrate is greater than an etching barrier capability of the at least a portion material of the second conductive structure, when an etchant (for example, etching solution) is used to etch the second conductive structure (for example, a stacked layer of a metal layer and a metal oxide layer), which is formed subsequently and for example is adjacent to the first conductive structure, the first conductive structure is not susceptible to etching attack by the etchant.

For example, the first conductive structure is a single layer film structure. For example, in a case where the first conductive structure is a single layer film structure, at least the first portion of the first conductive structure is crystallized (for example, the entire first conductive structure is crystallized or only the first portion of the first conductive structure is crystallized), that is, a crystallinity of the first portion of the first conductive structure is greater than or equal to a crystallinity of the second portion of the first conductive structure. In the embodiment of the present disclosure, a material of the portion where the upper surface of the first conductive structure is located is a crystallized material, such as a crystallized conductive oxide, and therefore the upper surface of the first conductive structure has a strong etching barrier capability.

For example, the first conductive structure of a single layer film structure is formed as follows: forming a first conductive layer film on the base substrate; patterning the first conductive layer film to form a first conductive pattern; and at least partially crystallizing the first conductive pattern from a side of the first conductive pattern away from the base substrate to form the first conductive structure.

For example, the first conductive structure is in a multi-layer film structure (that is, in a stacked structure), and comprises a first conductive layer and a barrier layer stacked on a side of the first conductive layer away from the base substrate. For the above etchant, the barrier layer has a stronger etching barrier capability (that is, is less susceptible to be etched) than the first conductive layer, so that the upper surface of the first conductive structure has a strong etching barrier capability.

For example, the first conductive structure of a multilayer film structure is formed as follows: forming a first conductive layer film on the base substrate, forming a barrier layer film on the first conductive layer film, and patterning the first conductive layer film and the barrier layer film to form a first conductive layer and a barrier layer respectively, in which the first conductive structure comprises the first conductive layer and the barrier layer.

Because the first conductive structure is formed first, and then the second conductive structure is formed by etching with an etchant, therefore, in some embodiments, the second conductive structure comprises an overlap portion that overlaps an orthographic projection of the first conductive structure on the base substrate, and the first conductive structure comprises a portion between the overlap portion of the second conductive structure and the base substrate.

In some embodiments, after the step of forming the first conductive structure, the step of forming the second conductive structure is directly performed (that is, there is no step of forming other films between the step of forming the first conductive structure and the step of forming the second conductive structure). Therefore, a first lower surface of the first conductive structure close to the base substrate and a second lower surface of the second conductive structure close to the base substrate are both in direct contact with the same layer (such as, the base substrate).

In other embodiments, after the step of forming the first conductive structure, the step of forming the second conductive structure is directly performed (that is, there is no step of forming other films between the step of forming the first conductive structure and the step of forming the second conductive structure). Therefore, an upper surface of the first conductive structure away from the base substrate and an upper surface of the second conductive structure away from the base substrate are both in direct contact with the same layer (such as, an insulation layer covering the first conductive structure and the second conductive structure).

For example, one of the first conductive structure and the second conductive structure is a first touch electrode structure, and the first touch electrode structure comprises a plurality of block-shaped first sub-electrode patterns and a plurality of strip-shaped second sub-electrode patterns. The electronic substrate further comprises a second touch electrode structure, the second touch electrode structure and the first touch electrode structure are located in different layers, and the second touch electrode structure electrically connects adjacent first sub-electrode patterns which are spaced apart by the second sub-electrode patterns.

For example, in order to ensure electrical connection between the second touch electrode structure and the first sub-electrode patterns, in a case where the first conductive structure comprises a portion between the overlap portion of the second conductive structure and the base substrate, a material of the portion where the upper surface of the first conductive structure is located is a conductive material.

For example, the other of the first conductive structure and the second conductive structure is a wiring structure for touch signal transmission. For example, the wiring structure is a multilayer film structure, and the wiring structure comprises a stacked layer of a first wiring layer and a second wiring layer which are sequentially stacked on the base substrate and/or a stacked layer of a second wiring layer and a third wiring layer which are sequentially stacked on the base substrate. The first wiring layer is used to improve the adhesion between the second wiring layer and the base substrate, and the third wiring layer is used to prevent the second wiring layer from being oxidized.

For example, in a case where the wiring structure comprises the first wiring layer, the second wiring layer, and the third wiring layer, forming the wiring structure comprises: sequentially forming a first wiring layer film, a second wiring layer film, and a third wiring layer film on the base substrate, and patterning a stacked layer of the first wiring layer film, the second wiring layer film, and the third wiring layer film to form the wiring structure.

For example, the above patterning process for forming each structure is, for example, a photolithography process, and the photolithography process may comprise: forming a photoresist pattern by coating, exposure, and development on a film (a single layer film or a multilayer film) for forming a desired structure; and using an etchant to etch the film by taking the photoresist pattern as a mask.

For example, for etching of the multilayer film structure, the etchants used for a plurality of films in the multilayer film structure are different, or at least two films are etched by using the same etchant.

The present disclosure is described below with reference to some specific embodiments. In order to make the following description of the embodiments of the present disclosure clear and concise, detailed description of known functions and known components may be omitted. In a case where any component of an embodiment of the present disclosure appears in more than one of the drawings, the component may be denoted by the same reference numeral in each of the drawings. In the following embodiments, the present disclosure is described by taking a case where the electronic substrate is a touch substrate, the first conductive structure is a first touch electrode structure, the second conductive structure is a wiring structure, the third conductive structure is a second touch electrode structure, and the etchant is the etching solution as an example. The present disclosure comprises, but is not limited to, the embodiments listed below. In the touch substrate provided in other embodiments, the first conductive structure may be the wiring structure, and the second conductive structure may be the first touch electrode structure, as long as it can be ensured that the upper surface of the conductive structure formed first has a strong etching barrier capability.

Figure 1B:
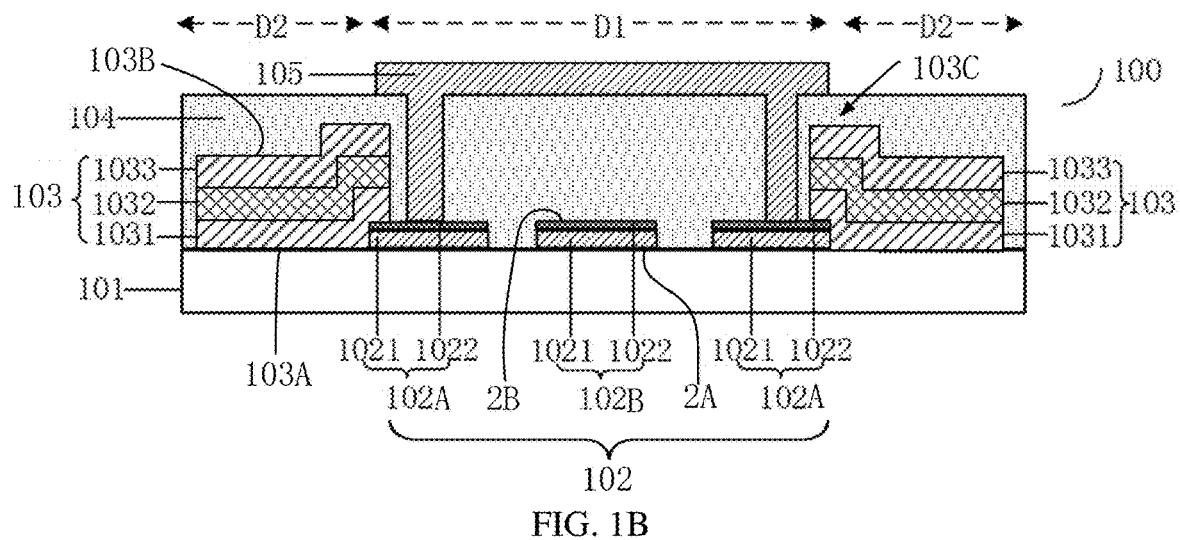
Figure 2A:
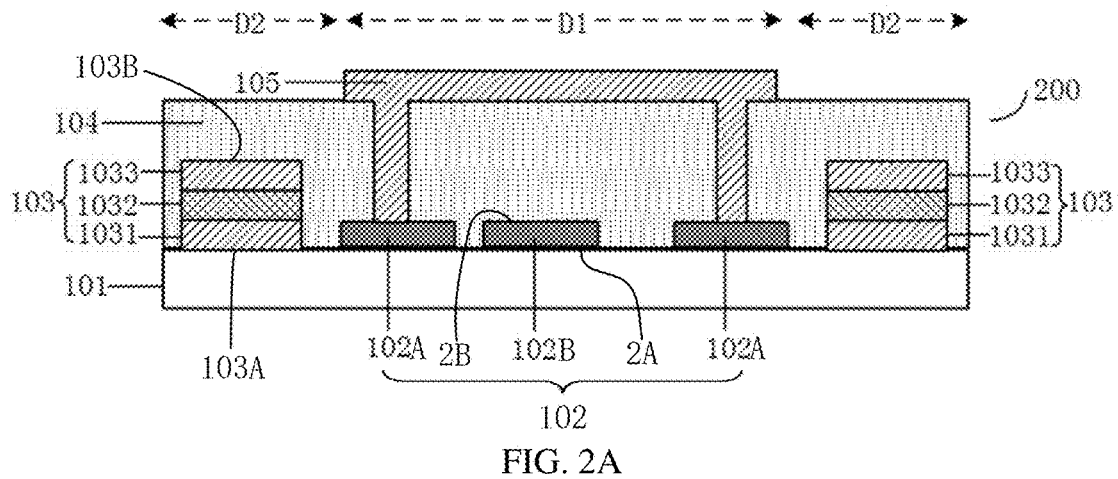
FIG. 2A and FIG. 2B are schematic cross-sectional structural views of another touch substrate according to an embodiment of the present disclosure.
Figure 2B:
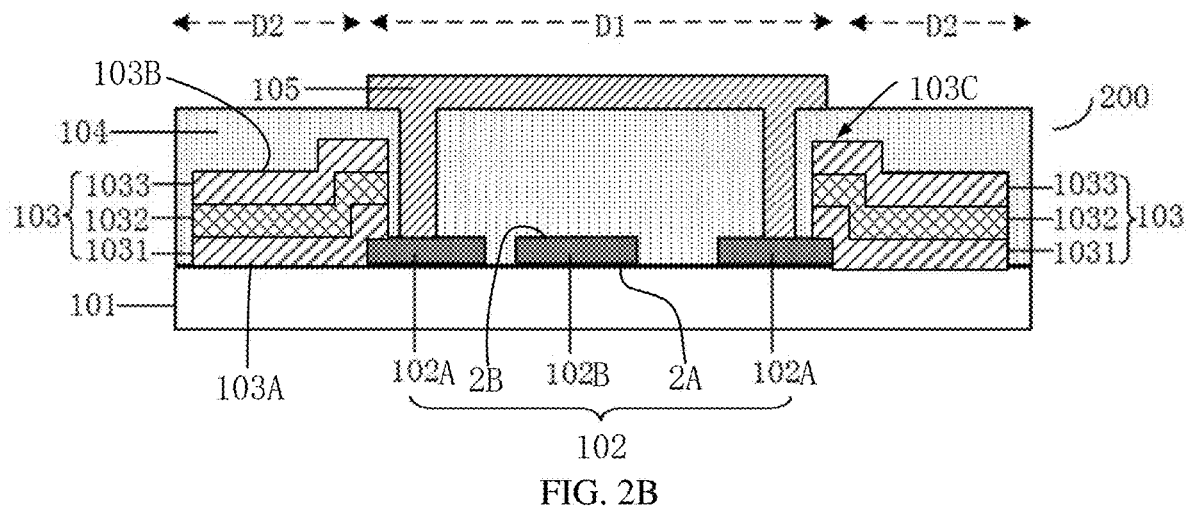
Figure 3A:
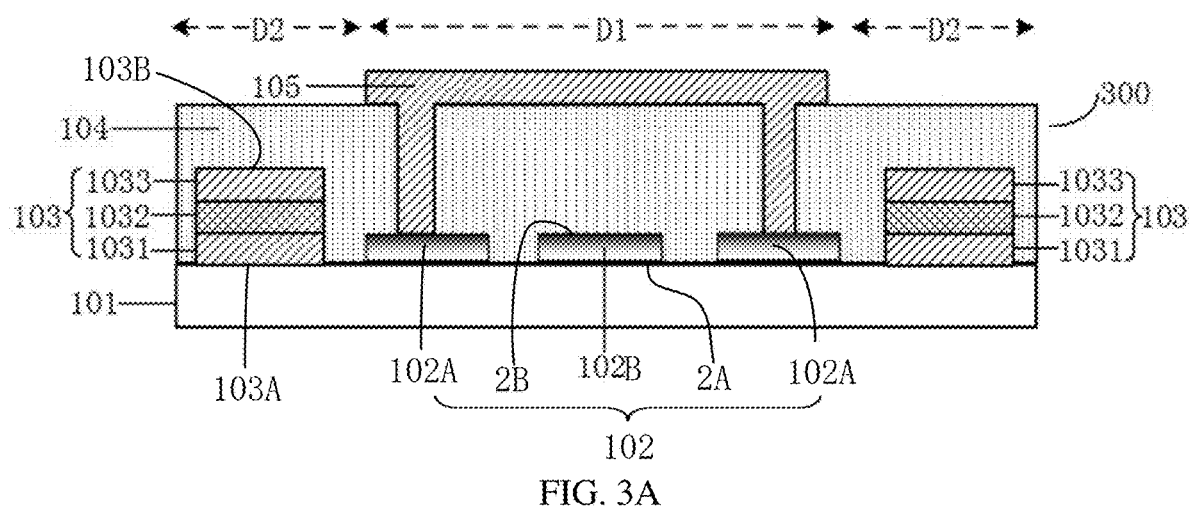
FIG. 3A and FIG. 3B are schematic cross-sectional structural views of still another touch substrate according to an embodiment of the present disclosure.
Figure 3B:
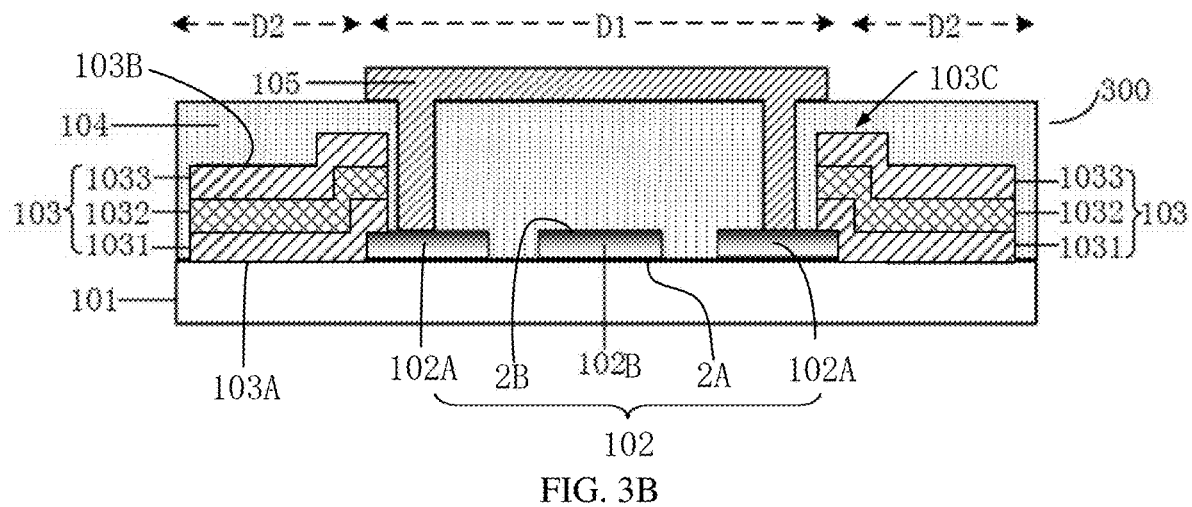

At least one embodiment of the present disclosure provides a touch substrate 100 as shown in FIGS. 1A and 1B, a touch substrate 200 as shown in FIGS. 2A and 2B, and a touch substrate 300 as shown in FIGS. 3A and 3B.

As shown in FIGS. 1A to 3B, the touch substrate 100/200/300 comprises a base substrate 101 and a first touch electrode structure 102. The first touch electrode structure 102 is disposed on the base substrate 101, and a portion (namely, the first portion where the upper surface 2B is located) of the first touch electrode structure 102 on a side of the first touch electrode structure 102 away from the base substrate 101 has an etching barrier property.

For example, as shown in FIGS. 1A, 1B, 3A, and 3B, the first touch electrode structure 102 has such an etching barrier property: for the same etchant, an etching barrier capability of an upper portion (i.e., the first portion) of the first touch electrode structure 102 is greater than an etching barrier capability of a lower portion (i.e., the second portion) of the first touch electrode structure 102, so that the first portion is less susceptible to be etched than the second portion.

For example, as shown in FIGS. 1A to 3B, the touch substrate 100/200/300 comprises a first touch electrode structure 102 and a wiring structure 103 that are on the base substrate 101, and the first touch electrode structure 102 has such an etching barrier property: for an etchant for etching at least a portion material of the wiring structure 103, at least a portion (the first portion where the upper surface 2B is located) of the first touch electrode structure 102 on a side of the first touch electrode structure 102 away from the base substrate 101 has an etching barrier capability greater than an etching barrier capability of the at least a portion material of the wiring structure 103, that is, the upper surface 2B of the first touch electrode structure 102 is less susceptible to be etched by the etchant than the at least a portion material of the wiring structure 103. In this case, for example, the etching barrier capability of the first portion of the first touch electrode structure 102 is greater than or equal to the etching barrier capability of the second portion of the first touch electrode structure 102.

For example, as shown in FIGS. 1A to 3B, the electronic substrate 100/200/300 further comprises an insulation layer 104 covering the first touch electrode structure 102 and a second touch electrode structure 105 on the insulation layer 104, the second touch electrode structure 105 and the first touch electrode structure 102 are located in different layers. As shown in FIG. 6I, the first touch electrode structure 102 comprises a plurality of block-shaped first sub-electrode patterns 102A and a plurality of strip-shaped second sub-electrode patterns 102B. As shown in FIGS. 1A to 3B, the insulation layer 104 exposes a portion of a surface of the first sub-electrode patterns 102A, and the second touch electrode structure 105 electrically connects adjacent first sub-electrode patterns 102A which are spaced apart by the second sub-electrode patterns 102B.

For example, as shown in FIGS. 1A to 3B, the first touch electrode structure 102 is located between the base substrate 101 and the second touch electrode structure 105. In this case, a material of the portion where the upper surface 2B of the first touch electrode structure 102 is located is a conductive material, so as to ensure the electrical connection between the first sub-electrode pattern 102A of the first touch electrode structure 102 and the second touch electrode structure 105. In other embodiments, for example, in a case where the second touch electrode structure 105 is located between the base substrate 101 and the first touch electrode structure 102, the material of the portion where the upper surface 2B of the first touch electrode structure 102 is located may also be a conductive material.

For example, as shown in FIGS. 1A to 3B, a first lower surface 2A of the first touch electrode structure 102 close to the base substrate 101 and a second lower surface 103A of the wiring structure 103 close to the base substrate 101 are both in direct contact with the base substrate 101.

For example, as shown in FIGS. 1A to 3B, the upper surface 2B of the first touch electrode structure 102 away from the base substrate 101 and the upper surface 103B of the wiring structure 103 away from the base substrate 101 are both in direct contact with the insulation layer 104.

For example, as shown in FIGS. 1B, 2B and 3B, the electronic substrate 100/200/300 further comprises a wiring structure 103 for implementing touch signal transmission. As shown in FIG. 6I, the wiring structure 103 comprises a plurality of signal transmission lines, and each of the signal transmission lines is electrically connected to one row or one column of sub-electrode patterns. For example, the wiring structure 103 comprises an overlap portion 103C overlapping the orthographic projection of the first touch electrode structure 102 on the base substrate 101, and the first touch electrode structure 102 comprises a portion between the overlap portion 103C of the wiring structure 103 and the base structure 101.

For example, as shown in FIGS. 1B, 2B and 3B, the entire overlap portion 103C of the wiring structure 103 is in direct contact with the first touch electrode structure 102. Thus, the overlap portion 103C of the wiring structure 103 can also protect the first touch electrode structure 102.

As shown in FIGS. 1A to 3B, the base substrate 101 may be, for example, a glass substrate, a quartz substrate, a plastic substrate, or a substrate with other suitable material, which is not specifically limited in the embodiments of present disclosure.

As shown in FIGS. 1A and 1B, the first touch electrode structure 102 is a multilayer structure and comprises a first conductive layer (such as a first electrode layer) 1021 and a barrier layer 1022 stacked on the first conductive layer 1021. For example, an orthographic projection of the barrier layer 1022 on the base substrate 101 coincides with an orthographic projection of the first conductive layer 1021 on the base substrate 101. For example, for an etchant for etching at least a portion material of the wiring structure 103, an etching barrier capability of the barrier layer 1022 is greater than an etching barrier capability of the first conductive layer 1021.

For example, a material of the first conductive layer 1021 and a material of the barrier layer 1022 both comprise a conductive oxide. For example, in a case where the touch substrate 100 composed of the first touch electrode structure 102 is applied to a display panel, the first touch electrode structure 102 is generally disposed on a display area of the display panel, and therefore a transparent conductive material is selected as a material constituting the first touch electrode structure 102, for example, the material of the first conductive layer 1021 and the material of the barrier layer 1022 are transparent conductive oxides.

For example, a crystallinity of the material of the first conductive layer 1021 is less than a crystallinity of the material of the barrier layer 1022, so that the etching barrier capability of the barrier layer 1022 is greater than the etching barrier capability of the first conductive layer 1021. For example, the material of the first conductive layer 1021 comprises a conductive oxide (such as an amorphous conductive oxide), the material of the barrier layer 1022 comprises a combination of at least one or more selected form a group consisting of a crystallized metal, a crystallized conductive oxide, and a polymer conductive material, such as one or more of a group consisting of crystallized gold, crystallized silver, crystallized aluminum, crystallized platinum, crystallized palladium, crystallized aluminum-doped zinc oxide, crystallized fluorine-doped tin oxide, grapheme, polypyrrole, polythiophene, poluaniline, and the like.

For example, in an example of the embodiment, the material of the first conductive layer 1021 comprises a conductive oxide, such as a transparent conductive oxide (for example, an amorphous transparent conductive oxide), and the material of the barrier layer 1022 comprises a crystallized conductive oxide (for example, a crystallized transparent conductive oxide).

For example, the conductive oxide included in the first conductive layer 1021 and the barrier layer 1022 may be, for example, indium tin oxide (abbreviated as ITO), indium zinc oxide (abbreviated as IZO), stannic oxide (the chemical formula is $SnO_2$), and the like.

For example, in a case where the first conductive layer 1021 is composed of indium tin oxide (for example, amorphous indium tin oxide) and the barrier layer 1022 is composed of crystallized indium tin oxide, because a crystallization operation is performed on the barrier layer 1022, a ratio (mass ratio) of $In_2O_3$ to $SnO_2$ in the indium tin oxide of the barrier layer 1022 is higher than a ratio (mass ratio) of $In_2O_3$ to $SnO_2$ in the indium tin oxide of the first conductive layer 1021. For example, the ratio of $In_2O_3$ to $SnO_2$ in the indium tin oxide of the barrier layer 1022 is, for example, greater than or equal to 93:7, and the ratio of $In_2O_3$ to $SnO_2$ in the indium tin oxide of the first conductive layer 1021 is, for example, about between 89:11 and 91:9.

For example, in another example of an embodiment of the present disclosure, the first conductive layer 1021 is composed of indium zinc oxide, and the barrier layer 1022 is composed of crystallized indium zinc oxide. For example, a ratio (mass ratio) of $In_2O_3$ to $ZnO_2$ in the indium zinc oxide of the barrier layer 1022 is higher than a ratio (mass ratio) of $In_2O_3$ to $ZnO_2$ in the indium zinc oxide of the first conductive layer 1021.

It should be noted that, the conductive oxide included in the first conductive layer 1021 and the conductive oxide included the barrier layer 1022 comprise at least part same elements (for example, both comprises indium and/or zinc, etc.), alternatively, elements in the conductive oxide included in the first conductive layer 1021 and elements in the conductive oxide included in the barrier layer 1022 are different.

For example, the first conductive layer 1021 and the barrier layer 1022 may also be composed of different materials, such as be formed by using materials including different elements respectively. For example, in another example of the embodiment of the present disclosure, the material of the first conductive layer 1021, for example, may be indium tin oxide or indium zinc oxide, and the material of the barrier layer 1022, for example, may be any suitable crystallized transparent conductive materials such as crystallized aluminum-doped zinc oxide, crystallized fluorine-doped tin oxide, or the like. For example, in another example of the embodiment of the present disclosure, the material of the first conductive layer 1021, for example, may be indium tin oxide or indium zinc oxide, and the material of the barrier layer 1022, for example, may be grapheme, polypyrrole, polythiophene, polyaniline or any other suitable organic polymeric transparent conductive material.

In the embodiments shown in the FIGS. 1A and 1B above, the first touch electrode structure 102 comprises a first conductive layer 1021 and a barrier layer 1022 on the first conductive layer 1021. In the embodiments of the present disclosure, for example, a weak acid such as hydrofluoric acid and the like may be selected to etch a metal or a metal oxide included in the subsequently formed wiring structure 103, the weak acid such as hydrofluoric acid and the like cannot etch the barrier layer 1022 or has a small etching rate to the barrier layer 1022, and therefore the barrier layer 1022 can prevent the first conductive layer 1021 from being etched by the etching solution when other metal layers/metal oxide layers are etched.

As shown in FIGS. 1A to 3B, the wiring structure 103 is disposed on the base substrate 101 and is located on the same layer as the first touch electrode structure 102. As shown in FIGS. 1A to 3B, the wiring structure 103 of a stacked structure comprises a first wiring layer 1031, a second wiring layer 1032, and a third wiring layer 1033, and the first wiring layer 1031, the second wiring layer 1032, and the third wiring layer 1033 are sequentially stacked on the base substrate 101. For example, a material of the first wiring layer 1031 and a material of the third wiring layer 1033 comprise an amorphous conductive oxide (for example, an amorphous transparent conductive oxide), which may be, for example, indium tin oxide or indium zinc oxide which has good ductility. For example, examples of a material of the second wiring layer 1032 comprise metals such as silver, copper, aluminum, chromium, molybdenum, titanium, silver alloy, copper alloy, aluminum-neodymium alloy, copper-molybdenum alloy, molybdenum-neodymium alloy, or any combination thereof, which is not specifically limited in the embodiments of the present disclosure.

In the embodiments of the present disclosure, for example, as shown in FIGS. 1A-3B, the touch substrate 100/200/300 comprises a touch area D1 and a non-touch area D2, the first touch electrode structure 102 is disposed in the touch area D1, and the wiring structure 103 is at least partially located in the non-touch area D2. For example, in a case where the wiring structure 103 refers to a peripheral wire of the touch substrate 100, the wiring structure 103 is disposed in the non-touch area D2 of the touch substrate 100; in a case where the wiring structure 103 refers to all wires of the touch substrate 100, the wiring structure 103 can be disposed in the touch area D1 and the non-touch area D2 of the touch substrate 100.

In the embodiments of the present disclosure, the wiring structure 103 is formed by sequentially stacking the first wiring layer 1031, the second wiring layer 1032, and the third wiring layer 1033. Because indium tin oxide or indium zinc oxide has good ductility and oxidation resistance, the first wiring layer 1031 composed of a conductive oxide such as indium tin oxide, indium zinc oxide, and the like may serve as a buffer layer of the second wiring layer 1032 formed on the first wiring layer 1031, and is used to ameliorate adhesion between the second wiring layer 1032 and the base substrate 101. The third wiring layer 1033 composed of a conductive oxide such as indium tin oxide, indium zinc oxide, and the like can serve as a protective layer of the second wiring layer 1032, so as to prevent the second wiring layer 1032 from being exposed to the air, so that the second wiring layer 1032 can be prevented from being oxidized.

The stacked structure of the wiring structure 103 comprises, but is not limited to, the embodiments shown in FIG. 1A to 3B. For example, in another example of the embodiment of the present disclosure, the wiring structure 103 may comprise, for example, the first wiring layer 1031 and the second wiring layer 1032 which are sequentially stacked on the base substrate 101, and not comprise the third wiring layer 1033. In this example, a material of the first wiring layer 1031 comprises a conductive oxide (for example, a transparent conductive oxide), such as indium tin oxide, indium zinc oxide, or the like. Examples of a material of the second wiring layer 1032 comprise metals such as silver, copper, aluminum, chromium, molybdenum, titanium, silver alloy, copper alloy, aluminum-neodymium alloy, copper-molybdenum alloy, molybdenum-neodymium alloy, or any combination thereof, which is not specifically limited in the embodiments of the present disclosure. For example, in another example of the embodiment of the present disclosure, the wiring structure 103, for example, may comprise the second wiring layer 1032 and the third wiring layer 1033 which are sequentially stacked on the base substrate 101, and not comprise the first wiring layer 1031.

It should be noted that, in the embodiments of the present disclosure, the positional relationship between the wiring structure 103 and the first touch electrode structure 102 comprises, but is not limited thereto, for example, in another example of the embodiment, the wiring structure 103 is disposed on the first touch electrode structure 102, for example, is formed on an insulation layer or a passivation layer (a via hole exposing the first touch electrode structure 102 is disposed in the insulation layer or the passivation layer) which covers the first touch electrode structure 102.

As shown in FIGS. 1A to 3B, an insulation layer 104 is disposed on the base substrate 101 and covers the wiring structure 103 and the first touch electrode structure 102, and the insulation layer 104 has a plurality of via holes exposing the first touch electrode structure 102. Examples of a material of the insulation layer 104 comprise SiNx, SiOx, or other suitable materials, and the embodiments of the present disclosure are not limited thereto.

As shown in FIGS. 1A to 3B, the second touch electrode structure 105 is disposed on the base substrate 101 and is located in a different layer from the first touch electrode structure 102, and the second touch electrode structure 105 is electrically connected to the first touch electrode structure 102 through a plurality of via holes in the insulation layer 104. Of course, the positional relationship between the second touch electrode structure 105 and the first touch electrode structure 102 comprises, but is not limited to, the case shown in FIG. 1. For example, in another example of the embodiment of the present disclosure, the second touch electrode structure 105 is located between the base substrate 101 and the first touch electrode structure 102 and is electrically connected to the first touch electrode structure 102. An example of the material of the second touch electrode structure 102 comprises a conductive oxide (for example, a transparent conductive oxide), such as indium tin oxide, indium zinc oxide, or other suitable materials, which is not limited in the embodiments of the present disclosure.

For example, the touch substrate 100/200/300 provided by the embodiments of the present disclosure may further comprise a touch detection chip, and the first touch electrode structure 102 and the second touch electrode structure 105 are connected to the touch detection chip through the wiring structure 103, so as to receive or transmit touch signals to implement a touch function.

It should be noted that, for the sake of clarity, the drawings do not show all structures of the touch substrate 100/200/300. In order to achieve the essential function of the touch substrate, those skilled in the art can set other structures not shown according to a specific application scenario, the embodiments of the present disclosure are not limited thereto.

As shown in FIGS. 1A and 1B, in the touch substrate 100 provided by at least one embodiment of the present disclosure, the first touch electrode structure 102 comprises a first conductive layer 1021 disposed on the base substrate 101 and a barrier layer 1022 disposed on a side of the first conductive layer 1021 away from the base substrate 101, the barrier layer 1022 has a barrier property to an etching solution for etching the same material as the first conductive layer 1021, when the first wiring layer 1031, the second wiring layer 1032, and the third wiring layer 1033 constituting the wiring structure 103 are etched, even if the etching solution used has an etching effect on the first conductive layer 1021, the barrier layer 1022 can protect the first conductive layer 1021 from the adverse effects of the etching solution.

In addition, in at least one embodiment, the first wiring layer 1031, the second wiring layer 1032, and the third wiring layer 1033 are sequentially stacked to form the wiring structure 103. The first wiring layer 1031 may serve as a buffer layer of the second wiring layer 1032 formed on the first wiring layer 1031, and is used to ameliorate adhesion of the second wiring layer 1032. The third wiring layer 1033 can serve as a protective layer of the second wiring layer 1032, so as to prevent the second wiring layer 1032 from being exposed to the air, so that the second wiring layer 1032 can be prevented from being oxidized. In addition, the wiring structure 103 of a stacked structure can be formed by one photolithography process (one example of the above-described patterning process), and therefore, on one hand, the process cost and the mask cost can be saved, and on the other hand, the alignment between different layers caused by a plurality of etching of a plurality of films is omitted, so that a line width of the wiring structure 103 can be further refined, and for example, the wiring structure 103 can have a line width of about 10 μm.

As shown in FIGS. 2A and 2B, in the touch substrate 200 provided in this example, the first touch electrode structure 102 is disposed on the base substrate 101 and is a single layer structure, the entire first touch electrode structure 102 is a crystallized conductive oxide, that is, the material constituting the first touch electrode structure 102 is a crystallized conductive oxide (for example, a transparent conductive oxide), such as crystallized indium tin oxide, crystallized indium zinc oxide, or the like. For example, in a case where the first touch electrode structure 102 is composed of crystallized indium tin oxide, a ratio of $In_2O_3$ to $SnO_2$ in the indium tin oxide of the first touch electrode structure 102 is, for example, greater than or equal to 93:7. Because the indium tin oxide or the indium zinc oxide is crystallized, the molecular structure of the indium tin oxide or the indium zinc oxide changes, and the etching solution having a weak acid property such as hydrofluoric acid has small corrosion effect on the crystallized indium tin oxide or the crystallized indium zinc oxide, and therefore the crystallized first touch electrode structure 102 can have a barrier property to the etching solution having a weak acid property. For example, when the wiring structure 103 is etched by using an etching solution such as hydrofluoric acid and other weak acid, even if the etching solution used has an etching effect on the material used to form the first touch electrode structure 102 before the material is crystallized, the crystallized first touch electrode structure 102 can also be prevented from the etching attack of the etching solution.

As shown in FIGS. 3A and 3B, in the touch substrate 300 provided in this example, the first touch electrode structure 102 is disposed on the base substrate 101 and is a single layer structure, the first touch electrode structure 102 is composed of a conductive oxide, for example, is composed of a transparent conductive oxide such as indium tin oxide or indium zinc oxide, and a portion of the first touch electrode structure 102 on a side of the first touch electrode structure 102 away from the base substrate 101 is crystallized. A darker portion of the first touch electrode structure 102 in FIG. 3 indicates a crystallized portion, for example, the crystallinity gradually decreases from the upper surface to a lower position in the drawing.

For example, in a case where the first touch electrode structure 102 is composed of indium tin oxide, a ratio of $In_2O_3$ to $SnO_2$ in the indium tin oxide in the crystallized portion of the first touch electrode structure 102 is higher than a ratio of $In_2O_3$ to $SnO_2$ in the indium tin oxide in the non-crystallized portion of the first touch electrode structure 102. For example, the ratio of $In_2O_3$ to $SnO_2$ in the indium tin oxide in the crystallized portion of the first touch electrode structure 102 is, for example, greater than or equal to 93:7, and the ratio of $In_2O_3$ to $SnO_2$ in the indium tin oxide in the non-crystallized portion of the first touch electrode structure 102 is, for example, approximately between 89:11 and 91:9.

For example, in another example of the embodiment of the present disclosure, in a case where in the first touch electrode structure 102 is composed of indium zinc oxide, a ratio of $In_2O_3$ to $ZnO_2$ in the indium zinc oxide in the crystallized portion of the first touch electrode structure 102 is higher than a ratio of $In_2O_3$ to $ZnO_2$ in the indium zinc oxide in the non-crystallized portion of the first touch electrode structure 102.

Because the indium tin oxide or the indium zinc oxide is crystallized, the molecular structure of the indium tin oxide or the indium zinc oxide changes, and the etching solution having a weak acid property such as hydrofluoric acid has small corrosion effect on the crystallized indium tin oxide or the crystallized indium zinc oxide, and therefore the crystallized portion of the first touch electrode structure 102 has a barrier property to the etching solution. For example, when the wiring structure 103 is etched by using an etching solution such as hydrofluoric acid or other weak acid, even if the etching solution has an etching effect on the non-crystallized portion of the first touch electrode structure 102 on a side of the first touch electrode structure 102 close to the base substrate, the crystallized portion of the first touch electrode structure 102 on a side of the first touch electrode structure 102 away from the base substrate 101 can also protect the first touch electrode structure 102 from the adverse effects of the etching solution.

For example, an embodiment of the present disclosure further provides an electronic device, and the electronic device comprises any of the electronic substrates described in the above embodiments. The electronic device may be any product or component having a touch function, such as a touch panel, a display panel, a display device, a television, an electronic paper, a mobile phone, a tablet computer, a notebook computer, a digital camera, a navigator, or the like. The embodiment of the present disclosure is described by taking a case that the electronic device is a display device as an example, the display device further comprises a display panel, a touch substrate may be formed separately and then be combined with the display panel, or may be integrally formed with the display panel by sharing a part of components with the display panel. It should be noted that, the embodiments of the present disclosure do not limit the mode in which the touch substrate and the display panel are combined.

For example, a base substrate 101 of the touch substrate may be a protective cover plate, and the protective cover plate is covered on the display panel for protecting the display panel, and a side of the protective cover plate on which the first touch electrode structure 102 is formed faces the display panel. That is, the combination mode of the touch substrate and the display panel is an OGS (one glass solution) mode.

For another example, the base substrate 101 of the touch substrate may be a color filter substrate of the display panel, the color filter substrate is used to be assembled to a cell with an array substrate, and the first touch electrode structure 102 of the touch substrate is disposed on a side of the color filter substrate away from the array substrate. That is, the touch substrate and the display panel are combined in an On-Cell mode.

For still another example, the base substrate 101 of the touch substrate may also be a color film substrate, the color filter substrate is used to be assembled to a cell with an array substrate, and the first touch electrode structure 102 of the touch substrate is disposed on a side of the color filter substrate facing the array substrate. That is, the touch substrate and the display panel are combined in an In-cell mode.

The technical effects of the display device provided by the embodiments of the present disclosure may refer to the technical effects of any of the touch substrates described in the above embodiments, and details are not described herein again.

An embodiment of the present disclosure further provides a manufacture method of a touch substrate 100/200/300, and the manufacture method comprises: forming a first touch electrode structure 102 on a base substrate 101; and then forming a wiring structure 103 on the base substrate 101. In the manufacture method, a portion on which an upper surface 2B of the first touch electrode structure 102 is located has an etching barrier property.

An embodiment of the present disclosure provides a manufacture method of a first touch electrode structure 102 in a touch substrate 100, FIGS. 4A-4D are schematic cross-sectional structural views of a first touch electrode structure 102 of a touch substrate 100 in a manufacture process according to an embodiment of the present disclosure.

Figure 4A:
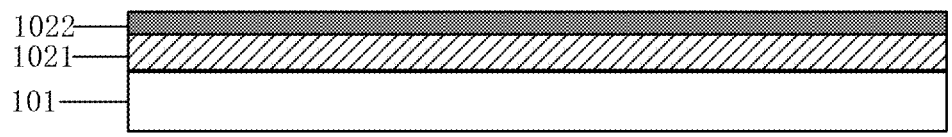
FIGS. 4A-4D are schematic cross-sectional structural views of a first touch electrode structure of a touch substrate in a manufacture process according to another embodiment of the present disclosure.

As shown in FIG. 4A, a base substrate 101 is provided first, and the base substrate 101 may be, for example, a glass substrate, a quartz substrate, a plastic substrate, or a substrate of other suitable material.

As shown in FIG. 4A, for example, an electrode layer film 21 (an example of a first conductive layer film) and a barrier layer film 22 may be sequentially deposited on the base substrate 101. For example, the electrode layer film 21 may be deposited on the base substrate 101 by a method of, for example, a chemical vapor deposition, a physical vapor deposition, or the like. An example of a material of the electrode layer film 21 comprises a conductive oxide (for example, an amorphous conductive oxide), such as a transparent conductive oxide such as indium tin oxide or indium zinc oxide, which is not specifically limited in the embodiments of the present disclosure. For example, in a case where the electrode layer film 21 is composed of indium tin oxide (for example, amorphous indium tin oxide), a ratio of $In_2O_3$ to $SnO_2$ in the indium tin oxide of the electrode layer film 21 can be, for example, approximately between 89:11 and 91:9.

After the electrode layer film 21 is formed, the barrier layer film 22 can be deposited on the electrode layer film 21 by a method of, for example, a chemical vapor deposition, a physical vapor deposition or the like. A material of the barrier layer film 22 may be, for example, crystallized indium tin oxide or crystallized indium zinc oxide, or any suitable crystallized conductive material (for example, crystallized transparent conductive material) such as crystallized aluminum-doped zinc oxide or fluorine-doped tin oxide; or may also be any suitable organic polymer conductive material (for example, an organic polymer transparent conductive material) such as graphene, polypyrrole, polythiophene, poluaniline, and the like, and the embodiment of the present disclosure does not specifically limit the material of the barrier layer film 22. For example, in a case where the barrier layer film 22 is composed of crystallized indium tin oxide, a ratio of $In_2O_3$ to $SnO_2$ in the indium tin oxide of the barrier layer film 22 is, for example, greater than or equal to 93:7, and thus, the ratio of $In_2O_3$ to $SnO_2$ in the indium tin oxide of the barrier layer film 22 is higher than a ratio of $In_2O_3$ to $SnO_2$ in the indium tin oxide of the electrode layer film 21. For example, in another example of the embodiment of the present disclosure, the electrode layer film 21 may be formed of, for example, indium zinc oxide, the barrier layer film 22 can be formed of crystallized indium zinc oxide, and a ratio of $In_2O_3$ to $ZnO_2$ in the indium zinc oxide of the barrier layer film 22 is higher than a ratio of $In_2O_3$ to $ZnO_2$ in the indium zinc oxide of the electrode layer film 21.

Figure 4B:
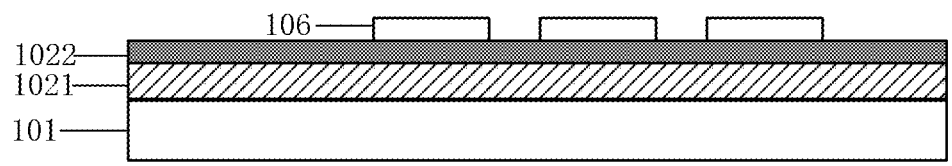

As shown in FIG. 4B, after the barrier layer film 22 is deposited on the electrode layer film 21, a photoresist layer is formed on the entire surface of the barrier layer film 22. The photoresist layer is patterned by a photolithography process comprising an exposure process and a development process, so as to form a photoresist pattern 106 having a desired shape on the barrier layer film 22.

Figure 4C:
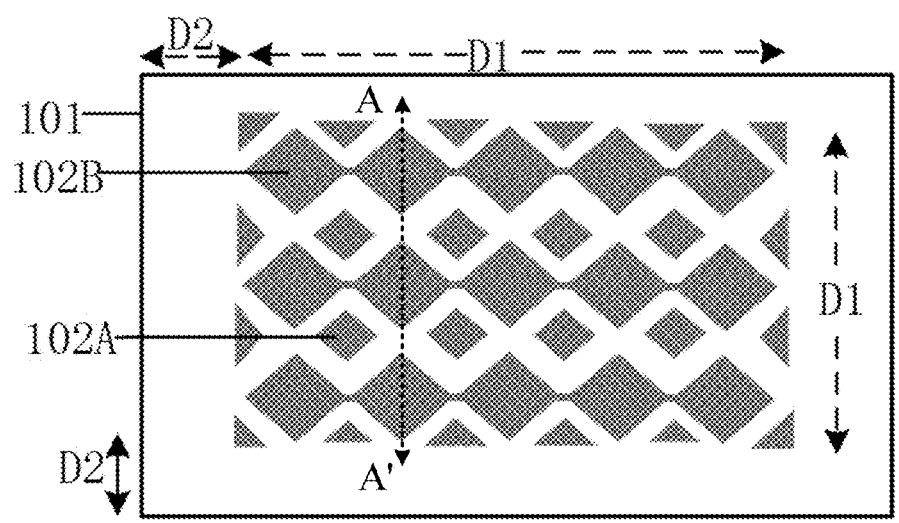
Figure 4D:
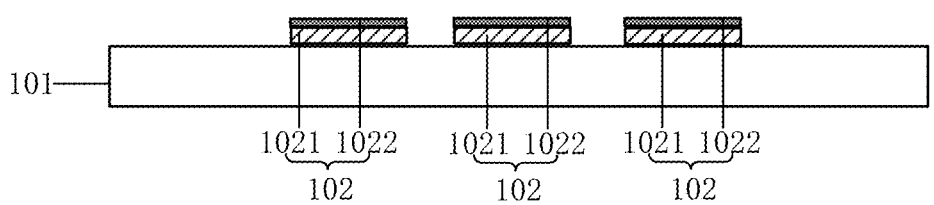

FIG. 4C is a plane structure schematic diagram of the first touch electrode structure 102 formed, and FIG. 4D is a schematic cross-sectional structural view taken along a line A-A' of FIG. 4C.

Referring to FIGS. 4C and 4D, the barrier layer film 22 and the electrode layer film 21 are patterned by using the above photoresist pattern 106 as an etching mask to form a first conductive layer 1021 and a barrier layer 1022 on the base substrate 101, the first conductive layer 1021 and the barrier layer 1022 constitute a first touch electrode structure 102 of a stacked structure, and the first touch electrode structure 102 comprises a plurality of first sub-electrode patterns 102A and a plurality of second sub-electrode patterns 102B, and the plurality of first sub-electrode patterns 102A and the plurality of second sub-electrode patterns 102B are interlaced. Because the barrier layer film 22 is a combination of at least one or more selected form a group consisting of a crystallized metal, a crystallized conductive oxide, and an organic polymer conductive film, for example, the etching solution having a weak acid property such as hydrofluoric acid cannot etch the barrier layer film 22 or has a very low etching rate to the barrier layer film 22, and therefore a strong acid such as aqua regia or the like needs to be selected as the etching solution to etch and pattern the barrier layer film 22 and the electrode layer film 21 to form the first touch electrode structure 102 of a stacked structure.

In the touch substrate 100 formed by at least one embodiment of the present disclosure, the first touch electrode structure 102 comprises a first conductive layer 1021 formed on the base substrate 101 and a barrier layer 1022 formed on a side of the first conductive layer 1021 away from the base substrate 101. The barrier layer 1022 has a barrier property to the etching solution, for example, when etching the subsequently formed metal oxide layer, even if the etching solution has an etching effect on the first conductive layer 1021, the barrier layer 1022 can also protect the first conductive layer 1021 from the adverse effects of the etching solution.

FIGS. 5A-5E are schematic cross-sectional structural views of a first touch electrode structure 102 of a touch substrate 200 in a manufacture process according to another example of an embodiment of the present disclosure.

Figure 5A:
FIGS. 5A-5E are schematic cross-sectional structural views of a first touch electrode structure of another touch substrate in a manufacture process according to another embodiment of the present disclosure.

As shown in FIG. 5A, a base substrate 101 is provided first, and the base substrate 101 may be, for example, a glass substrate, a quartz substrate, a plastic substrate, or a substrate of other suitable material.

As shown in FIG. 5A, for example, an electrode layer film 21 (an example of a first conductive layer film) may be deposited on the base substrate 101 by a method of, for example, a chemical vapor deposition, a physical vapor deposition, or the like. An example of a material of the electrode layer film 21 comprises a conductive oxide (for example, an amorphous conductive oxide), such as an amorphous transparent conductive oxide such as indium tin oxide (ITO), indium zinc oxide (IZO), zinc oxide (ZnO), and the like, which is not specifically limited in the embodiments of the present disclosure. For example, in a case where the electrode layer film 21 is composed of indium tin oxide, a ratio of $In_2O_3$ to $SnO_2$ in the indium tin oxide of the electrode layer film 21 can be, for example, approximately between 89:11 and 91:9.

Figure 5B:
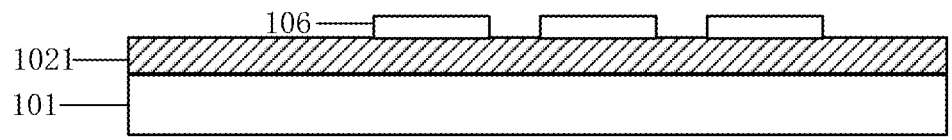

As shown in FIG. 5B, after the electrode layer film 21 is formed on the base substrate 101, a photoresist layer is formed on the entire surface of the electrode layer film 21. The photoresist layer is patterned by a photolithography process comprising an exposure process and a development process, so as to form a photoresist pattern 106 having a desired shape on the electrode layer film 21.

Figure 5C:
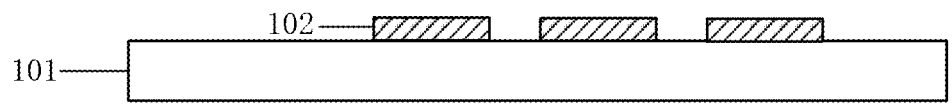

As shown in FIG. 5C, the electrode layer film 21 is patterned by using the above photoresist pattern 106 as an etching mask to form an amorphous first touch electrode structure pattern 1020 on the base substrate 101. Because the electrode layer film 21 is composed of an amorphous conductive metal oxide (for example, an amorphous transparent conductive metal oxide), the etching solution having a weak acid property such as hydrofluoric acid can be selected to etch the electrode layer film 21 to form the amorphous first touch electrode structure pattern 1020.

Figure 5D:
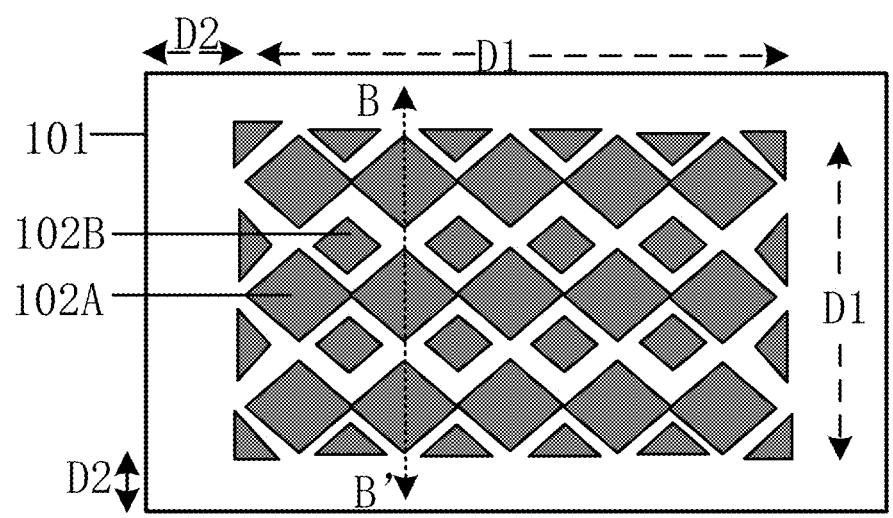
Figure 5E:
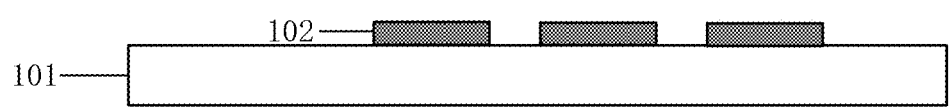

FIG. 5D is a plane structure schematic diagram of the first touch electrode structure 102 formed, and FIG. 5E is a schematic cross-sectional structural view taken along a line B-B' of FIG. 5D. Referring to FIGS. 5D and 5E, after the amorphous first touch electrode structure pattern 1020 is formed, an annealing process is performed on the amorphous first touch electrode structure pattern 1020, and an annealing method may be, for example, an annealing method such as RTA (rapid thermal annealing), ELA (excimer laser annealing), a furnace annealing, or the like. During the annealing process, the molecular structure of the material constituting the first touch electrode structure pattern 1020 changes, so that the amorphous first touch electrode structure pattern 1020 becomes the crystallized first touch electrode structure 102. For example, in a case where the amorphous first touch electrode structure pattern 1020 is composed of indium tin oxide, a ratio of $In_2O_3$ to $SnO_2$ in the indium tin oxide of the crystallized first touch electrode structure 102 is higher than a ratio of $In_2O_3$ to $SnO_2$ in the indium tin oxide of the amorphous first touch electrode structure pattern 1020. For example, in an example of the embodiment of the present disclosure, the ratio of $In_2O_3$ to $SnO_2$ in the indium tin oxide of the amorphous first touch electrode structure pattern 1020 is approximately between 89:11 and 91:9, and the ratio of $In_2O_3$ to $SnO_2$ in the indium tin oxide of the crystallized first touch electrode structure 102 may be, for example, greater than or equal to 93:7. For example, in another example of the embodiment of the present disclosure, in a case where the amorphous first touch electrode structure pattern 1020 is composed of indium zinc oxide, a ratio of $In_2O_3$ to $ZnO_2$ in the indium zinc oxide of the crystallized first touch electrode structure 102 is higher than a ratio of $In_2O_3$ to $ZnO_2$ in the indium zinc oxide of an amorphous first touch electrode structure 102. As shown in FIG. 5D, the formed crystallized first touch electrode structure 102 comprises a plurality of first sub-electrode patterns 102A and a plurality of second sub-electrode patterns 102B, and the plurality of first sub-electrode patterns 102A and the plurality of second sub-electrode patterns 102B are interlaced.

It should be noted that, according to product design requirements, the first touch electrode structure 102 can be fully crystallized as described in the above examples; of course, the first touch electrode structure 102 can also be partially crystallized.

For example, in another example of the embodiment of the present disclosure, after the base substrate 101 is provided and the amorphous first touch electrode structure pattern 1020 is formed on the base substrate 101 according to the method described in FIGS. 5A-5C, the annealing process is performed on a part of the amorphous first touch electrode structure pattern 1020, the side of the amorphous first touch electrode structure pattern 1020 away from the base substrate 101 is crystallized by controlling factors such as annealing time and annealing rate. For example, in a case where the amorphous first touch electrode structure pattern 1020 is composed of indium tin oxide, a ratio of $In_2O_3$ to $SnO_2$ in the indium tin oxide of a corresponding crystallized portion of the first touch electrode structure 102 is higher than a ratio of $In_2O_3$ to $SnO_2$ in the indium tin oxide of the amorphous first touch electrode structure pattern 1020; alternatively, in a case where the amorphous first touch electrode structure pattern 1020 is composed of indium zinc oxide, a ratio of $In_2O_3$ to $ZnO_2$ in the indium zinc oxide of a corresponding crystallized portion of the first touch electrode structure 102 is higher than a ratio of $In_2O_3$ to $ZnO_2$ in the indium zinc oxide of the amorphous first touch electrode structure pattern 1020.

For example, in another example of the embodiment of the present disclosure, the first touch electrode structure 102 may be formed, for example, by controlling deposition conditions of the electrode layer film 21. An example of a material of the electrode layer film 21 comprises a transparent conductive oxide such as indium tin oxide (ITO), indium zinc oxide (IZO), zinc oxide (ZnO), or the like, which is not specifically limited in this example. Deposition conditions of electrode layer films of different materials are different, and this example is described by taking a case that the material of the electrode layer film 21 is indium tin oxide as an example.

For example, a base substrate 101 is provided first, and the base substrate 101 may be, for example, a glass substrate, a quartz substrate, a plastic substrate, or a substrate of other suitable material.

Then, for example, the indium tin oxide electrode layer film 21 may be deposited on the base substrate 101 by a method such as a chemical vapor deposition or a physical vapor deposition. By controlling the deposition conditions (such as deposition rate, deposition time, target bombardment rate, etc.), the ratio of $In_2O_3$ to $SnO_2$ in the formed electrode layer film 21 gradually increases in a direction from a side of the formed electrode layer film 21 close to the base substrate 101 to a side of the formed electrode layer film 21 away from the base substrate 101. For example, in the formed electrode layer film 21 on a side close to the base substrate 101, the ratio of $In_2O_3$ to $SnO_2$ in the indium tin oxide of the electrode layer film 21 can be, for example, approximately between 89:11 and 91:9; in the formed electrode layer film 21 on a side away from the base substrate 101, the ratio of $In_2O_3$ to $SnO_2$ in the indium tin oxide of the electrode layer film 21 can be, for example, greater than or equal to 93:7. By controlling the deposition conditions, the ratio of $In_2O_3$ to $SnO_2$ in the indium tin oxide of the electrode layer film 21 formed on the side away from the base substrate 101 is higher than the ratio of $In_2O_3$ to $SnO_2$ in the indium tin oxide of the electrode layer film 21 formed on the side close to the base substrate 101, so that the electrode layer film 21 can be prevented from being adversely affected by the etching solution in the photolithography process for subsequently manufacturing the wiring structure.

After the electrode layer film 21 is formed on the base substrate 101, a photoresist layer is then deposited on the entire surface of the electrode layer film 21. The photoresist layer is patterned by a photolithography process comprising an exposure process and a development process to form a photoresist pattern 106 having a desired shape on the electrode layer film 21. The electrode layer film 21 is patterned by using the above photoresist pattern 106 as an etching mask to form the first touch electrode structure 102 on the base substrate 101.

In the manufacture method of the first touch electrode structure 102 in the touch substrate 200 provided by at least one example, by performing a total crystallization process or a partial crystallization process on the first touch electrode structure 102, or by controlling deposition conditions, the molecular concentration in the formed electrode layer film 21 changes in gradient, and the molecular structures of the first touch electrode structure 102 change, so that the first touch electrode structure 102 has a barrier property to the etching solution. For example, when the subsequently formed metal layer/metal oxide layer is etched by using an etching solution having a weak acid property such as hydrofluoric acid, even if the etching solution has an etching effect on the amorphous first touch electrode structure pattern 1020, the first touch electrode structure 102 can be protected from the re-etching attack of the etching solution.

An embodiment of the present disclosure provides a manufacture method of a touch substrate, and the touch substrate comprises the touch substrate described in any of the above embodiments. The embodiment of the present disclosure is described by taking a manufacture method of a touch substrate 200 as an example, and FIGS. 6A-6J are schematic cross-sectional structural views of a touch substrate 200 in a manufacture process according to an embodiment of the present disclosure.

Figure 6A:
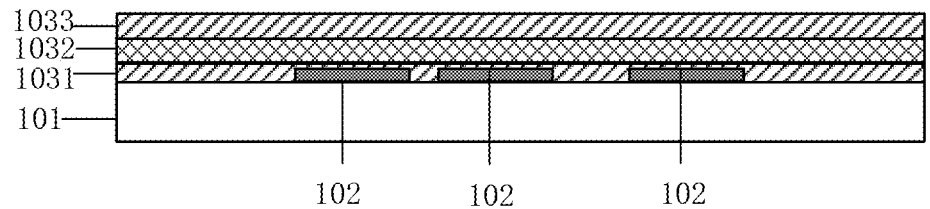
FIGS. 6A-6J are schematic cross-sectional structural views of a touch substrate in a manufacture process according to still another embodiment of the present disclosure.

As shown in FIG. 6A, referring to the manufacture method of FIGS. 5A-5E, after the crystallized first touch electrode structure 102 is formed on the base substrate 101, a first wiring layer film 31, a second wiring layer film 32, and a third wiring layer film 33 (the stacked layer of the three wiring layer films is an example of the above-described conductive film for forming the second conductive structure) are sequentially deposited on the base substrate 101, on which the crystallized first touch electrode structure 102 is formed, by a method of chemical vapor deposition, physical vapor deposition, or the like. In the embodiment of the present disclosure, examples of a material of the first wiring layer film 31 and a material of the third wiring layer film 33 comprise a conductive oxide (for example, an amorphous conductive oxide), for example, the conductive oxide is a transparent conductive oxide, such as indium tin oxide or indium zinc oxide having good ductility. For example, a thickness of the transparent conductive oxide is 50-200 angstroms (Å). An example of a material of the second wiring layer film 32 comprises metals such as silver, copper, aluminum, chromium, molybdenum, titanium, silver alloy, copper alloy, aluminum-neodymium alloy, copper-molybdenum alloy, molybdenum-neodymium alloy, or any combination of these metals, which is not specifically limited in the embodiments of the present disclosure.

Figure 6B:
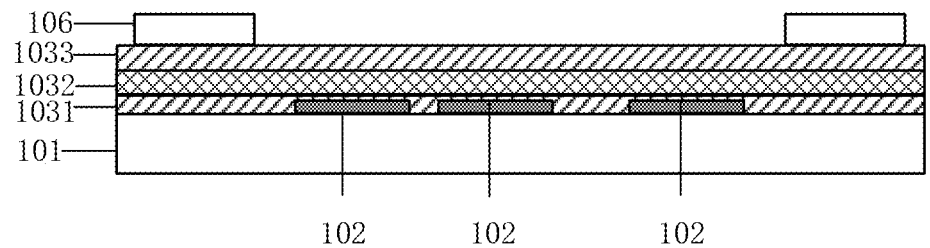

As shown in FIG. 6B, a photoresist layer is formed on the entire surface of the third wiring layer film 33, and the photoresist layer is patterned by a photolithography process comprising an exposure process and a development process to form a photoresist pattern 106 having a desired shape on the third wiring layer film 33.

Figure 6C:
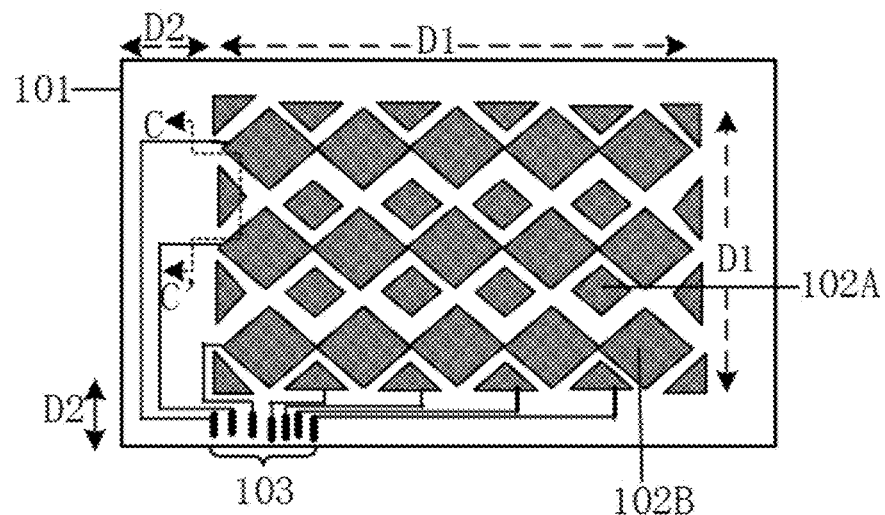
Figure 6D:
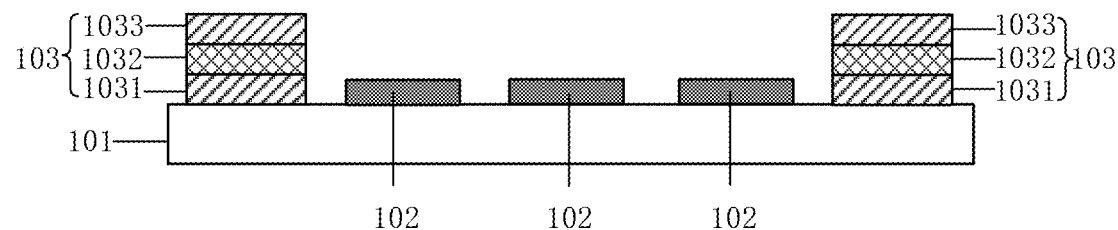

FIG. 6C is a plane structure schematic diagram of the electronic substrate 200 formed, and FIG. 6D is a schematic cross-sectional structural view taken along a line C-C' of FIG. 6C. Referring to FIGS. 6C and 6D, the first wiring layer film 31, the second wiring layer film 32, and the third wiring layer film 33 are simultaneously patterned by using the photoresist pattern 106 as an etching mask, so as to form a wiring structure 103 of a stacked structure on the base substrate 101, and the wiring structure 103 is electrically connected to the first touch electrode structure 102. The first wiring layer film 31, the second wiring layer film 32, and the third wiring layer film 33 are made of metal or metal oxide. When at least one of the first wiring layer film 31, the second wiring layer film 32, and the third wiring layer film 33 is etched, for example, the etching solution having a weak acid property such as hydrofluoric acid can be used to etch to form the wiring structure 103. Because the first touch electrode structure 102 is subjected to a crystallization process, the crystallized first touch electrode structure 102 has a good barrier property to the etching solution, and therefore the first touch electrode structure 102 can be protected from the etching attack of the etching solution having a weak acid property.

The touch substrate 200 comprises a touch area D1 and a non-touch area D2, as shown in FIGS. 6C and 6D, in the embodiment of the present disclosure, the first touch electrode structure 102 is formed in the touch area D1 of the touch substrate 200, and the wiring structure 103 is formed in the non-touch area D2 of the touch substrate 200.

It should be noted that, the positional relationship between the wiring structure 103 and the first touch electrode structure 102 comprises but is not limited thereto, for example, in another example of the embodiment, the wiring structure 103 may be, for example, formed on the first touch electrode structure 10, for example, formed on an insulation layer or a passivation layer covering the first touch electrode structure 102 (for example, a via hole exposing the first touch electrode structure 102 is disposed in the insulation layer or the passivation layer).

Figure 6E:
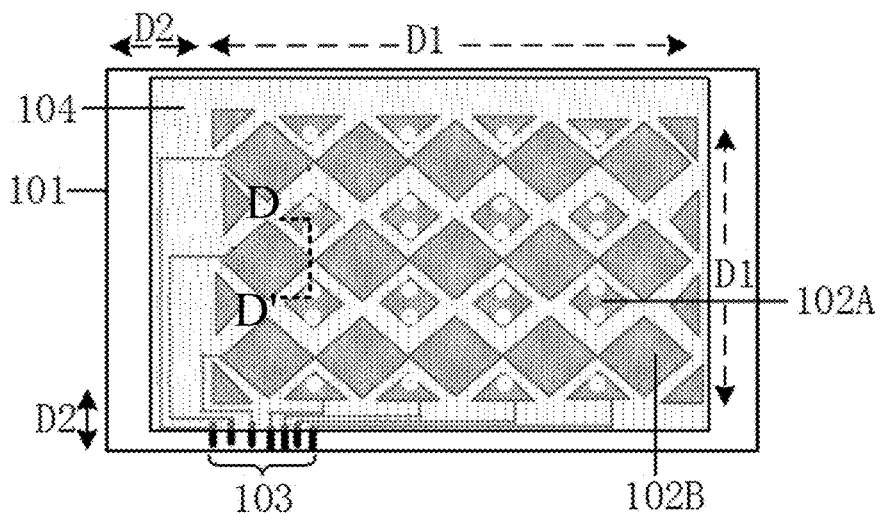
Figure 6F:
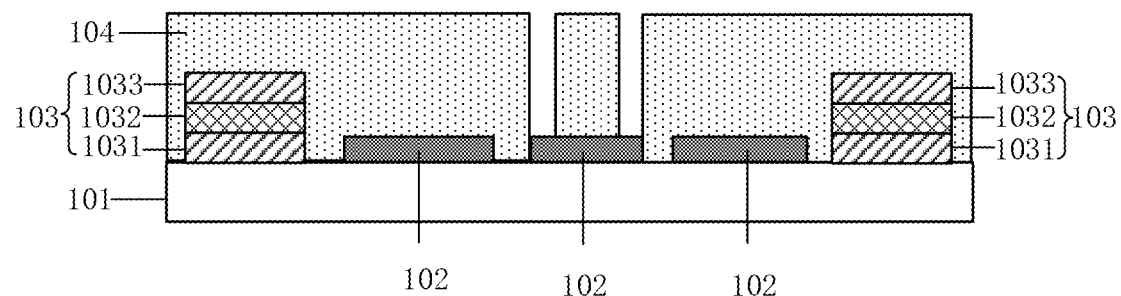

FIG. 6E is a plane structure schematic diagram of the touch substrate 200 formed, and FIG. 6F is a schematic cross-sectional structural view taken along a line D-D' of FIG. 6E. Referring to FIGS. 6E and 6F, after the first touch electrode structure 102 and the wiring structure 103 are sequentially formed on the base substrate 101, an insulation layer film is deposited on the base substrate 101, and the insulation layer film is patterned by a photolithography process to form the insulation layer 104. The insulation layer 104 covers the wiring structure 103 and the first touch electrode structure 102 and has a plurality of via holes exposing the first touch electrode structure 102. Examples of a material of the insulation layer 104 comprise an inorganic insulation material such as SiNx, SiOx, an organic insulation material such as a resin material, or other suitable materials, which is not limited by the embodiment of the present disclosure.

Figure 6G:
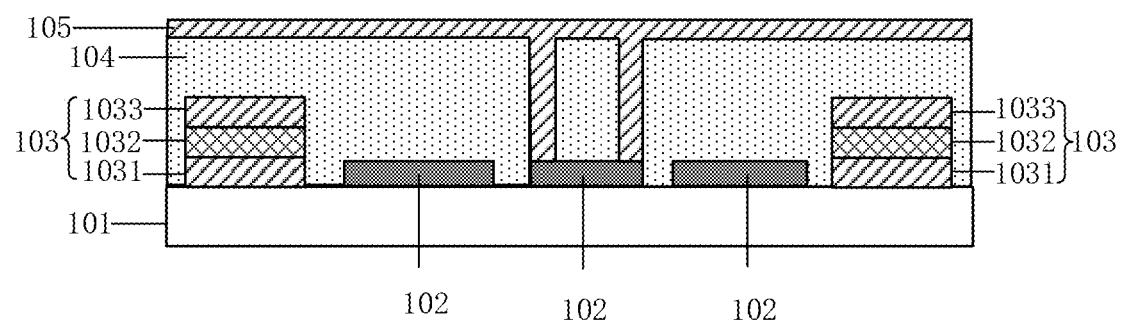

As shown in FIG. 6G, an electrode layer film 1050 is deposited on the base substrate 101, examples of a material of the electrode layer film 1050 comprise a metal or a transparent conductive oxide such as indium tin oxide or indium zinc oxide, which is not specifically limited in the embodiments of the present disclosure.

Figure 6H:
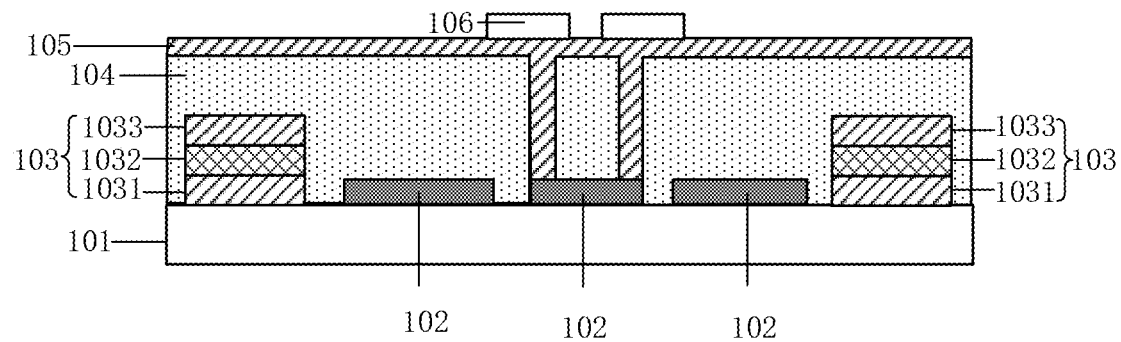
Figure 6I:
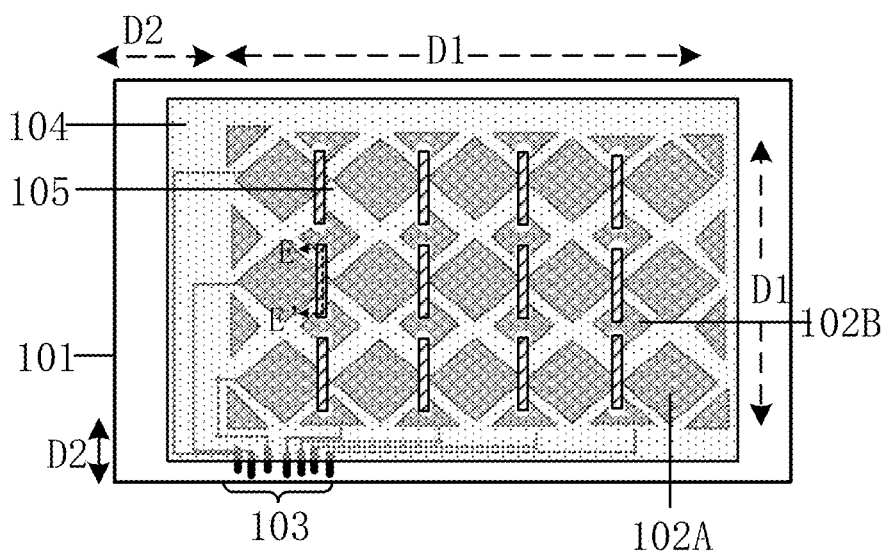

As shown in FIG. 6H, a photoresist layer is formed on the entire surface of the electrode layer film 1050, and the photoresist layer is patterned by a photolithography process comprising an exposure process and a development process to form a photoresist pattern 106 having a desired shape on the electrode layer film 1050.

Figure 6J:
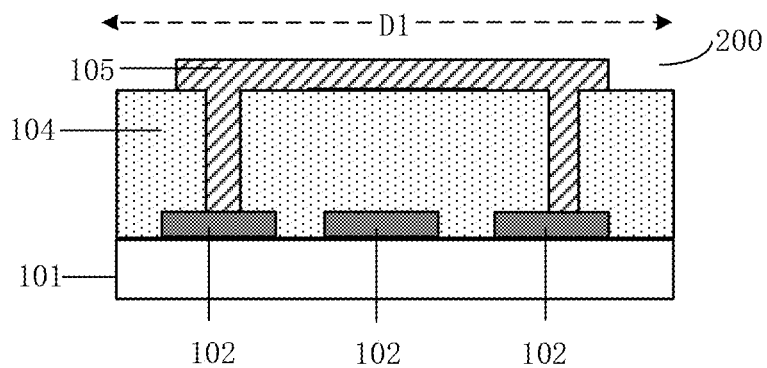

FIG. 6I is a plane structure schematic diagram of the touch substrate 200 formed, and FIG. 6J is a schematic cross-sectional structural view taken along a line E-E' of FIG. 6I. Referring to FIGS. 6I and 6J, the electrode layer film 1050 is patterned by using the above photoresist pattern 106 as an etching mask to form a second touch electrode structure 105 on the base substrate 101. As shown in FIGS. 6I and 6J, the first touch electrode structure 102 comprises a plurality of first sub-electrode patterns 102A and a plurality of second sub-electrode patterns 102B, the plurality of first sub-electrode patterns 102A and the plurality of second sub-electrode patterns 102B are interlaced, and the second touch electrode structure 105 electrically connects adjacent first sub-electrode patterns 102A which are spaced apart by the second sub-electrode patterns 102B.

It should be noted that, the positional relationship between the second touch electrode structure 105 and the first touch electrode structure 102 comprises but is not limited thereto, for example, in another example of the embodiment of the present disclosure, the second touch electrode structure 105 is located between the base substrate 101 and the first touch electrode structure 102, and is electrically connected to the first touch electrode structure 102.

For example, the touch substrate 200 provided by the embodiments of the present disclosure may further comprise a touch detection chip, and the first touch electrode structure 102 and the second touch electrode structure 105 are connected to the touch detection chip through the wiring structure 103, so as to receive or transmit touch signals to implement a touch function.

In the manufacture method of the touch substrate 200 provided by at least one embodiment of the present disclosure, the crystallized first touch electrode structure 102 has a barrier property to the etching solution by performing a crystallization process on the first touch electrode structure 102 to change the molecular structures of the first touch electrode structure 102. For example, when the first wiring layer film 31, the second wiring layer film 32, and the third wiring layer film 33 are etched using an etching solution having a weak acid property such as hydrofluoric acid to form the wiring structure 103, the crystallized first touch electrode structure 102 can be protected from etching attack by the etching solution.

In addition, in at least one embodiment, the first wiring layer 1031, the second wiring layer 1032, and the third wiring layer 1033 are sequentially stacked to form the wiring structure 103, the first wiring layer 1031 may serve as a buffer layer of the second wiring layer 1032 formed on the first wiring layer 1031, and is used to ameliorate a problem of insufficient adhesion of the second wiring layer 1032 on the base substrate 101. The third wiring layer 1033 can serve as a protective layer of the second wiring layer 1032, so as to prevent the second wiring layer 1032 from being exposed to the air, thereby avoiding a oxidation problem of the second wiring layer 1032. In addition, the wiring structure 103 of a stacked structure can be formed by one photolithography process, and therefore, on one hand, the process cost and the mask cost can be saved, and on the other hand, the alignment between different layers caused by a plurality of etching of a plurality of films is omitted, so that a line width of the wiring structure 103 can be further refined, and for example, the wiring structure 103 can have a line width of about 10 μm.

In case of no conflict, the respective embodiments of the present disclosure and the features in the embodiment(s) can be combined with each other to obtain new embodiment(s).

What have been described above are only exemplary implementations of the present disclosure and are not intended to limit the protection scope of the present disclosure, and the protection scope of the present disclosure should be determined by the appended claims.

What is claimed is:

1. An electronic substrate, comprising:
   a base substrate, and
   a first conductive structure on the base substrate, wherein a portion of the first conductive structure on a side of the first conductive structure away from the base substrate is a first portion, a portion of the first conductive structure on a side of the first conductive structure close to the base substrate is a second portion, and the first portion has an etching barrier property compared with the second portion,
   the electronic substrate further comprises a second conductive structure on the base substrate,
   wherein, for an etchant for etching at least a portion of a material of the second conductive structure, an etching barrier capability of the first portion of the first conductive structure is greater than an etching barrier capability of the at least the portion of the material of the second conductive structure,
   wherein the second conductive structure comprises an overlap portion overlapping an orthographic projection of the first conductive structure on the base substrate, and the first conductive structure comprises a portion between the overlap portion and the base substrate.

2. The electronic substrate according to claim 1, wherein a crystallinity of the first portion is greater than a crystallinity of the second portion.

3. The electronic substrate according to claim 1, wherein the first conductive structure is in a stacked structure and comprises a first conductive layer and a barrier layer stacked on a side of the first conductive layer away from the base substrate, and the barrier layer is the first portion.

4. The electronic substrate according to claim 3, wherein a crystallinity of a material of the first conductive layer is less than a crystallinity of a material of the barrier layer.

5. The electronic substrate according to claim 3, wherein both a material of the first conductive layer and a material of the barrier layer comprise conductive oxides.

6. The electronic substrate according to claim 5, wherein the conductive oxides are indium tin oxides, and a ratio of $In_2O_3$ to $SnO_2$ in indium tin oxide of the barrier layer is higher than a ratio of $In_2O_3$ to $SnO_2$ in indium tin oxide of the first conductive layer; or the conductive oxides are indium zinc oxides, and a ratio of $In_2O_3$ to $ZnO_2$ in indium zinc oxide of the barrier layer is higher than a ratio of $In_2O_3$ to $ZnO_2$ in indium zinc oxide of the first conductive layer.

7. The electronic substrate according to claim 3, wherein a material of the first conductive layer comprises a conductive oxide, and a material of the barrier layer comprises at least one or more of a group consisting of a crystallized metal, a crystallized conductive oxide, and a polymer conductive material.

8. The electronic substrate according to claim 1, wherein the overlap portion is entirely in direct contact with the first conductive structure.

9. The electronic substrate according to claim 1, wherein a first lower surface of the first conductive structure close to the base substrate and a second lower surface of the second conductive structure close to the base substrate are both in direct contact with the base substrate.

10. The electronic substrate according to claim 1, further comprising an insulation layer covering the first conductive structure and the second conductive structure, wherein the insulation layer directly contacts an upper surface of the first conductive structure away from the base substrate and an upper surface of the second conductive structure away from the base substrate.

11. The electronic substrate according to claim 1, wherein one of the first conductive structure and the second conductive structure is a wiring structure, and the wiring structure is in a stacked structure; and the wiring structure comprises a stacked layer of a first wiring layer and a second wiring layer which are sequentially stacked on the base substrate, or the wiring structure comprises a stacked layer of the second wiring layer and a third wiring layer which are sequentially stacked on the base substrate, or the wiring structure comprises a stacked layer of the first wiring layer, the second wiring layer, and the third wiring layer which are sequentially stacked on the base substrate.

12. The electronic substrate according to claim 11, wherein a material of at least one of the first wiring layer and the third wiring layer is at least partially identical to a material of the first conductive structure.

13. The electronic substrate according to claim 11, wherein a material of the first wiring layer and a material of the third wiring layer comprise a conductive oxide, and a material of the second wiring layer comprises a metal.

14. An electronic device, comprising the electronic substrate according to claim 1.

15. A manufacture method of an electronic substrate, comprising:

forming a first conductive structure on a base substrate, wherein a portion of the first conductive structure on a side of the first conductive structure away from the base substrate is a first portion, a portion of the first conductive structure on a side of the first conductive structure close to the base substrate is a second portion, and the first portion has an etching barrier property compared with the second portion; and forming a second conductive structure on the base substrate on which the first conductive structure is formed, wherein, for an etchant for etching at least a portion of a material of the second conductive structure, an etching barrier capability of the first portion of the first conductive structure is greater than an etching barrier capability of the at least the portion of the material of the second conductive structure, wherein the second conductive structure comprises an overlap portion overlapping an orthographic projection of the first conductive structure on the base substrate, and the first conductive structure comprises a portion between the overlap portion and the base substrate.

16. The method according to claim 15, wherein the forming the first conductive structure comprises: forming a first conductive layer film on the base substrate, patterning the first conductive layer film to form a first conductive pattern, and at least partially crystallizing the first conductive pattern from a side of the first conductive pattern away from the base substrate to form the first conductive structure; or the forming the first conductive structure comprises: forming the first conductive layer film on the base substrate, forming a barrier layer film on the first conductive layer film, and patterning the first conductive layer film and the barrier layer film to form a first conductive layer and a barrier layer respectively, wherein the first conductive structure comprises the first conductive layer and the barrier layer.

17. An electronic substrate, comprising:

a base substrate, a first conductive structure on the base substrate, and a second conductive structure on the base substrate, wherein, for an etchant for etching at least a portion of a material of the second conductive structure, an etching barrier capability of at least a portion of the first conductive structure on a side of the first conductive structure away from the base substrate is greater than an etching barrier capability of the at least the portion of the material of the second conductive structure, wherein the second conductive structure comprises an overlap portion overlapping an orthographic projection of the first conductive structure on the base substrate, and the first conductive structure comprises a portion between the overlap portion and the base substrate.

* * * * *